(12) United States Patent
Lee et al.

(10) Patent No.: US 11,616,215 B2
(45) Date of Patent: Mar. 28, 2023

(54) DISPLAY APPARATUS

(71) Applicant: Samsung Display Co., Ltd., Yongin-si (KR)

(72) Inventors: Hyeonbum Lee, Yongin-si (KR); Miran Ji, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 28 days.

(21) Appl. No.: 17/324,033

(22) Filed: May 18, 2021

(65) Prior Publication Data

US 2022/0131111 A1 Apr. 28, 2022

(30) Foreign Application Priority Data

Oct. 28, 2020 (KR) .......................... 10-2020-0141461

(51) Int. Cl.
*H01L 51/52* (2006.01)
*H01L 27/32* (2006.01)
*G06F 3/044* (2006.01)
*G06F 3/041* (2006.01)

(52) U.S. Cl.
CPC ........ *H01L 51/5275* (2013.01); *G06F 3/0412* (2013.01); *G06F 3/0443* (2019.05); *H01L 27/323* (2013.01); *H01L 27/3244* (2013.01); *H01L 2251/5338* (2013.01); *H01L 2251/558* (2013.01)

(58) Field of Classification Search
None
See application file for complete search history.

(56) References Cited

U.S. PATENT DOCUMENTS

| 10,644,083 | B2 | 5/2020 | Lee et al. | |
| 2019/0074339 | A1* | 3/2019 | Ma | .......................... H01L 27/323 |
| 2020/0050818 | A1* | 2/2020 | He | ..................... G06V 40/1394 |
| 2020/0243802 | A1 | 7/2020 | Ju et al. | |

FOREIGN PATENT DOCUMENTS

| KR | 1020190016635 A | 2/2019 |
| KR | 1020200014599 A | 2/2020 |
| KR | 1020200080753 A | 7/2020 |
| KR | 1020200092533 A | 8/2020 |

* cited by examiner

*Primary Examiner* — Duane N Taylor, Jr.
(74) *Attorney, Agent, or Firm* — Cantor Colburn LLP

(57) ABSTRACT

A display apparatus includes a substrate, in order from the substrate a display element including an emission area and a non-emission area, an input sensing layer including a first insulating layer corresponding to the non-emission area and defining a first opening corresponding to the emission area, and an optical functional layer including in order from the substrate a first layer having a refractive index, corresponding to the non-emission area and defining a second opening corresponding to the emission area, and a second layer facing the first layer, having a refractive index greater than the refractive index of the first layer and extending to the emission area, and an organic layer corresponding to the emission area. At the emission area, the second layer of the optical functional layer is directly on an upper surface of the organic layer which is closest to the optical functional layer.

30 Claims, 22 Drawing Sheets

FIG. 3A(1)
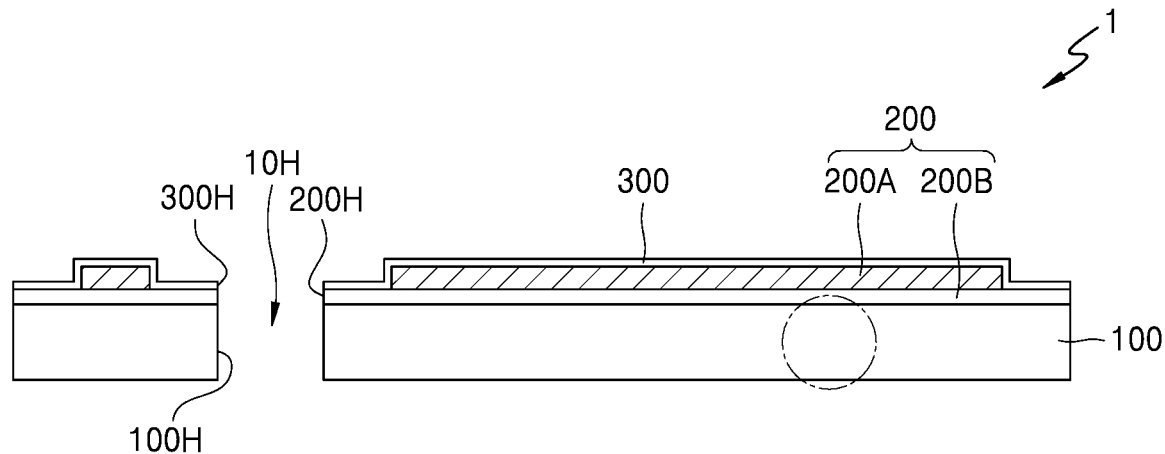
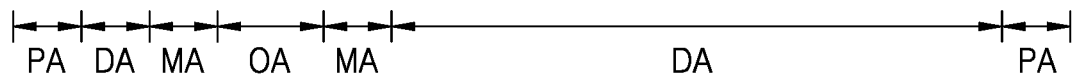
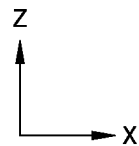
FIG. 3A(2)
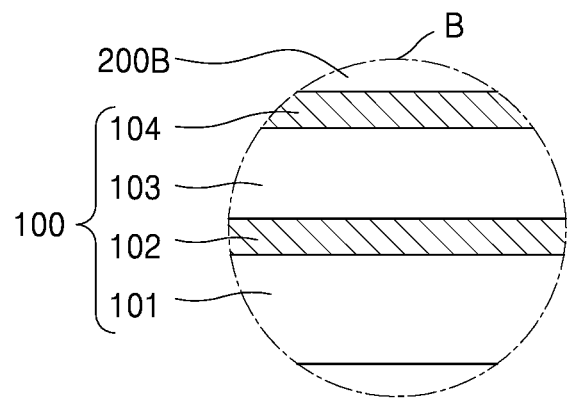

DISPLAY APPARATUS

This application claims priority to Korean Patent Application No. 10-2020-0141461, filed on Oct. 28, 2020, and all the benefits accruing therefrom under 35 U.S.C. § 119, the disclosure of which is incorporated by reference herein in its entirety.

BACKGROUND

1. Field

One or more embodiments relate to a display apparatus, and more particularly to a display apparatus providing high-quality images.

2. Description of Related Art

The usage of display apparatuses has diversified. Also, display apparatuses have become thinner and more lightweight, and thus, the use of display apparatuses has expanded. As display apparatuses are used in various fields, the demand for display apparatuses that provide high-quality images is increasing.

Among display apparatuses, an organic light-emitting display apparatus has wide viewing angles, high contrast and fast response times. Thus, the organic light-emitting display apparatus has attracted the attention as a next-generation display apparatus.

SUMMARY

In a conventional display apparatus, elements for protecting display elements emitting light or adding a function to the display apparatus may be arranged on the display elements to emit color light so as to provide an image. Therefore, the efficiency of light emitted from each of the display elements deteriorates due to the elements provided on the display elements.

One or more embodiments include a display apparatus providing high-quality images. However, this is merely an example, and the scope of the disclosure is not limited thereby.

Additional features will be set forth in part in the description which follows and, in part, will be apparent from the description, or may be learned by practice of the presented embodiments of the disclosure.

According to one or more embodiments, a display apparatus includes a substrate, a display element on the substrate, the display element including an emission area and a non-emission area, an organic layer on the display element, an optical functional layer on the organic layer, the optical functional layer including a first layer defining a first opening corresponding to the emission area, and a second layer on the first layer and having a refractive index greater than that of the first layer, and an input sensing layer between the display element and the optical function layer, the input sensing layer including a first insulating layer defining a second opening corresponding to the emission area, and a second insulating layer defining a third opening corresponding to the emission area. The second layer is directly on an upper surface of the organic layer.

In an embodiment, the input sensing layer may further include a third insulating layer on the display element, and the organic layer may be between the first insulating layer and the third insulating layer.

In an embodiment, the second layer may have a thickness of about 15 micrometers (μm) to about 20 μm from the upper surface of the organic layer.

In an embodiment, the refractive index of the second layer may be about 1.6 or more.

In an embodiment, the second layer may be in the second opening.

In an embodiment, the first layer may cover side surfaces of the first insulating layer and the second insulating layer.

In an embodiment, the input sensing layer may include a first conductive layer on the first insulating layer and a second conductive layer on the second insulating layer, and the first layer may cover the second conductive layer.

In an embodiment, the display apparatus may further include a first area in which the display element is arranged, a second area including a through hole, and a third area between the first area and the second area.

In an embodiment, at least a portion of the third insulating layer may be in the third area.

In an embodiment, the display apparatus may further include an organic planarization layer in the third area. At least a portion of the second layer may extend to the third area, and the second layer may be directly on the organic planarization layer.

In an embodiment, the organic layer and the organic planarization layer may include a same material.

In an embodiment, the display apparatus may further include an opening of the organic functional layer or a groove of the substrate in the third area, and a dam in the third area.

In an embodiment, the organic layer may partially overlap the emission area.

In an embodiment, the organic layer may be in the second opening and the third opening.

According to one or more embodiments, a display apparatus includes a substrate, a display element on the substrate, the display element including an emission area and a non-emission area, an input sensing layer on the display element, an anti-reflective layer on the input sensing layer, and an optical functional layer on the anti-reflective layer, the optical functional layer including a first layer defining a first opening corresponding to the emission area, and a second layer on the first layer and having a refractive index greater than that of the first layer.

In an embodiment, the input sensing layer may include a first insulating layer on the display element, a second insulating layer on the first insulating layer, a first conductive layer between the first insulating layer and the second insulating layer, and a second conductive layer on the second insulating layer.

In an embodiment, the anti-reflective layer may include a light shielding layer in which a second opening corresponding to the emission area is defined, and a color filter on the light shielding layer, and the light shielding layer may cover at least a portion of the second conductive layer.

In an embodiment, the first layer and the light shielding layer may at least partially overlap each other.

In an embodiment, the input sensing layer may further include a third insulating layer on the display element, and the display apparatus may further include a first organic layer between the first insulating layer and the third insulating layer.

In an embodiment, the display apparatus may further include a second organic layer between the anti-reflective layer and the optical functional layer.

According to one or more embodiments, a display apparatus includes a substrate including a first area in which a display element including an intermediate layer and an opposite electrode is arranged, a second area in which a through hole is arranged, and a third area between the first area and the second area, an organic layer on the first area, a dam on the third area, an organic planarization layer on the third area and including a same material as that of the organic layer, and an upper layer on the organic planarization layer and having a refractive index greater than that of the organic planarization layer. An organic functional layer of the intermediate layer and the opposite electrode extend from the first area to the third area, and the organic functional layer and the opposite electrode are disconnected at the third area.

In an embodiment, the display element may include an emission area and a non-emission area, and the display apparatus may further include an input sensing layer on the display element, and an optical functional layer on the input sensing layer. The optical functional layer may include a first layer defining a first opening corresponding to the emission area, and a second layer on the first layer and having a refractive index greater than that of the first layer.

In an embodiment, the input sensing layer may include a first insulating layer in which a second opening corresponding to the emission area is defined, and a second insulating layer in which a third opening corresponding to the emission area is defined, and the second layer may be directly on an upper surface of the organic layer.

In an embodiment, the second layer may include a same material as that of the upper layer.

In an embodiment, the second layer may have a thickness of about 15 µm to about 20 µm from the upper surface of the organic layer.

In an embodiment, the second layer may be in the second opening.

In an embodiment, the display apparatus may further include an anti-reflective layer between the input sensing layer and the optical functional layer. The anti-reflective layer may include a light shielding layer in which a second opening corresponding to the emission area is defined, and a color filter on the light shielding layer.

In an embodiment, the light shielding layer and the first layer may at least partially overlap each other.

In an embodiment, the display apparatus may further include a groove between the first area and the dam.

In an embodiment, the organic functional layer and the opposite electrode may be disconnected by the groove.

Other features and advantages of the disclosure will become better understood through the accompanying drawings, the claims and the detailed description.

BRIEF DESCRIPTION OF THE DRAWINGS

The above and other features, and advantages of embodiments of the disclosure will be more apparent from the following description taken in conjunction with the accompanying drawings, in which.

DETAILED DESCRIPTION

Figure 1:
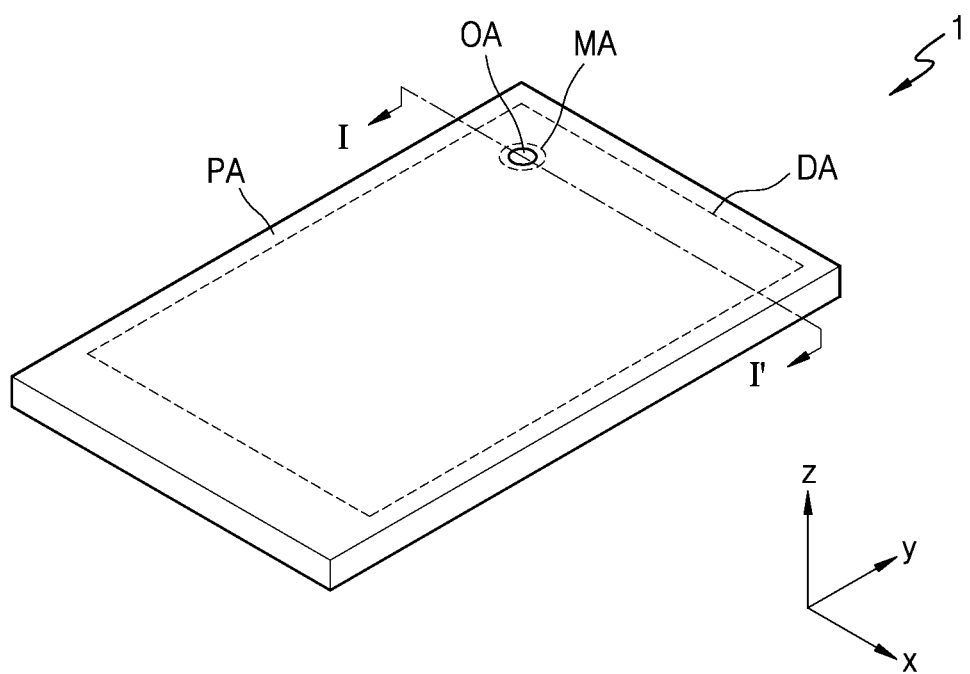
FIG. 1 is a schematic perspective view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the written description allows for various changes and numerous embodiments, embodiments will be illustrated in the drawings and described in detail in the written description. Effects and features of the disclosure and methods of achieving them will be clarified with reference to embodiments described below in detail with reference to the drawings. However, the disclosure is not limited to the following embodiments and may be embodied in various forms.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that although the terms "first," "second," etc. may be used herein to describe various elements, these elements should not be limited by these terms. These terms are only used to distinguish one element from another.

The terminology used herein is for the purpose of describing particular embodiments only and is not intended to be limiting. The singular forms "a," "an," and "the" as used herein are intended to include the plural forms as well unless the context clearly indicates otherwise. For example, "an element" has the same meaning as "at least one element," unless the context clearly indicates otherwise. "At least one" is not to be construed as limiting "a" or "an." "Or" means "and/or."

It will be further understood that the terms "comprises" and/or "comprising" used herein specify the presence of stated features or elements, but do not preclude the presence or addition of one or more other features or elements.

It will be further understood that, when a layer, region, or element is referred to as being related to another element such as being "on" another layer, region, or element, it can be directly or indirectly on the other layer, region, or element. That is, for example, intervening layers, regions, or elements may be present. In contrast, when a layer, region, or element is referred to as being related to another element such as being "directly on" another layer, region, or element, no intervening layer, region or element is present.

Sizes of elements in the drawings may be exaggerated or reduced for convenience of explanation. In addition, since sizes and thicknesses of elements in the drawings are arbitrarily illustrated for convenience of explanation, the disclosure is not limited thereto.

In this specification, the expression "A and/or B" indicates only A, only B, or both A and B. Throughout the disclosure, the expression "at least one of A and B" indicates only A, only B, or both A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, the term "in a plan view" means a view from above or normal to a plane, and the term "in a cross-sectional view" means a view of a cross-section along a normal direction of a target portion from the side thereof. In the following embodiments, the term "overlapping" may include overlapping "in a plan view" and "in a cross-sectional view."

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings. When describing embodiments with reference to the accompanying drawings, the same or corresponding elements are denoted by the same reference numerals.

FIG. 1 is a schematic perspective view of an embodiment of a display apparatus 1.

Referring to FIG. 1, the display apparatus 1 may include a first area DA and a second area OA which is arranged in the first area DA. The first area DA may partially surround the second area OA. Pixels P may be in the first area DA. The display apparatus 1 may provide an image by using light emitted from the pixels P in the first area DA. The first area DA may be a display area of the display apparatus 1.

According to an embodiment, a display element may be in the first area DA. The display element may be an organic light-emitting diode OLED including a pixel electrode 210 (in FIG. 9), an intermediate layer 220 (in FIG. 9) and an opposite electrode 230 (in FIG. 9).

Figure 2A:
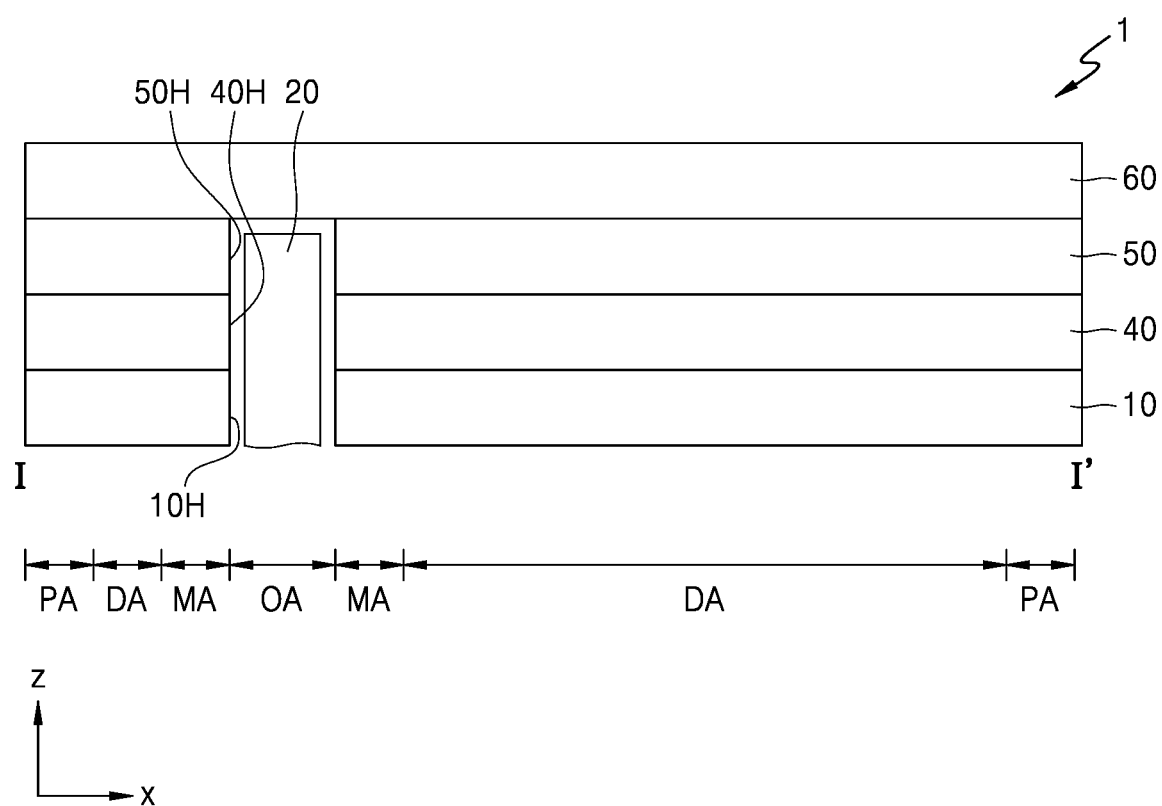
FIGS. 2A and 2B are schematic cross-sectional views of an embodiment of a display apparatus.

FIG. 1 illustrates that one of the second area OA is arranged inside the first area DA, and the second area OA may be completely surrounded by the first area DA. The second area OA may be a planar area in which a component 20 of the display apparatus 1 to be described later with reference to FIG. 2A is arranged.

A third area MA may be between the second area OA and the first area DA, and the first area DA may be surrounded by a fourth area PA. The third area MA and the fourth area PA may each be a non-display area in which pixels P are not arranged or are excluded. In an embodiment, the third area MA may be completely surrounded by the first area DA, and the first area DA may be completely surrounded by the fourth area PA. Various elements or layers of the display apparatus 1 may include a first area DA, a second area OA, a third area MA and/or a fourth area PA corresponding to those described above for the display apparatus 1.

Hereinafter, as the display apparatus 1, an organic light-emitting display apparatus will be described as an example, but the display apparatus 1 is not limited thereto. According to an embodiment, a display apparatus 1 such as a quantum dot light-emitting display may be used.

FIG. 1 illustrates that one of the second area OA is provided in a circular shape, but the disclosure is not limited thereto. The number of the second area OA may be two or more, and the shape of the second area OA may be variously changed. The second area OA may be provided in plural including second areas OA. In an embodiment, for example, each of the second areas OA may have a circular shape, an elliptical shape, a polygonal shape, a star shape or a diamond shape.

Figure 2B:
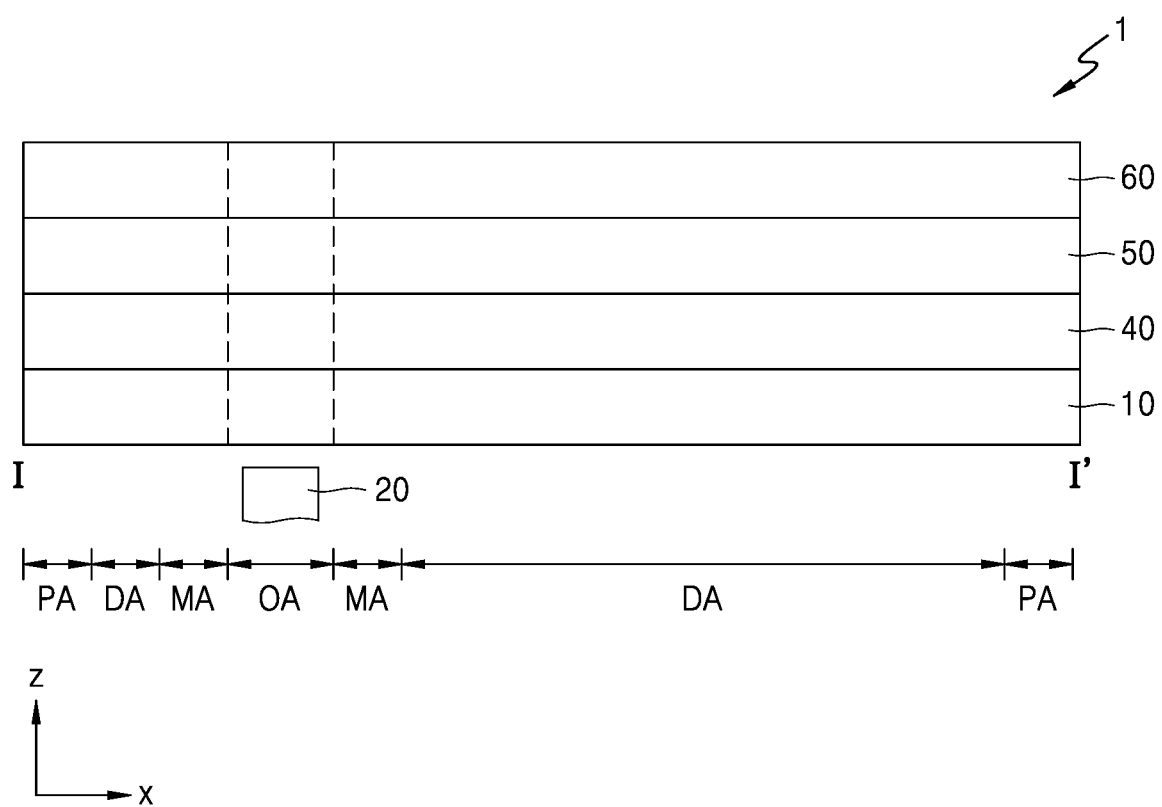

FIGS. 2A and 2B are schematic cross-sectional views of the display apparatus 1. FIGS. 2A and 2B are cross-sectional views of the display apparatus 1 taken along line I-I' of FIG. 1.

Referring to FIGS. 2A and 2B, the display apparatus 1 may include a display panel 10, and an input sensing layer 40 and an optical functional layer 50, which are on the display panel 10, in order. The display panel 10, the input sensing layer 40 and the optical functional layer 50 may be covered by a window 60. The display apparatus 1 may include various types of electronic apparatuses such as mobile phones, laptop computers and smart watches.

The display panel 10 may include pixels P in the first area DA. The pixels P may include a display element and a pixel circuit PC which is connected thereto. The display element may include an organic light-emitting diode OLED, a quantum dot organic light-emitting diode or the like. The display panel 10 may display an image through the pixels P in the first area DA.

The input sensing layer 40 may be on the display panel 10. The input sensing layer 40 may obtain coordinate information according to an external input, for example, a touch event. The input sensing layer 40 may include a sensing electrode (or a touch electrode) and a trace line which is electrically connected to the sensing electrode. The input sensing layer 40 may be above the display panel 10 in a thickness direction (e.g., a z direction crossing each of a first direction and a second direction). The input sensing layer 40 may be closer to the window 60 than the display panel 10. The input sensing layer 40 may sense an external input by using a mutual capacitance method and/or a self-capacitance method.

The input sensing layer 40 may be provided or formed directly on the display panel 10, or may be separately provided or formed and then bonded to the display panel 10 such as through an adhesive layer. The adhesive layer may include as an optical clear adhesive. As elements being directly on each other, the elements may form an interface therebetween.

In an embodiment, for example, the input sensing layer 40 may be continuously provided or formed after a process of providing or forming the display panel 10. In this case, the input sensing layer 40 may be understood as a portion of the display panel 10. The adhesive layer may not be between the input sensing layer 40 and the display panel 10. Although FIG. 2A illustrates that the input sensing layer 40 is between the display panel 10 and the optical functional layer 50, the input sensing layer 40 may be on the optical functional layer 50 to face the display panel 10 with the optical functional layer 50 therebetween.

The optical functional layer 50 may be on the input sensing layer 40. The optical functional layer 50 may include an anti-reflective member. The anti-reflective member may reduce reflectance of light from outside the display apparatus 1 (e.g., external light) and toward the display panel 10 through the window 60. The anti-reflective member may include a retarder and a polarizer. The retarder may be a film-type retarder or a liquid crystal coating-type retarder and may include a λ/2 retarder and/or a λ/4 retarder. Also, the polarizer may be a film-type polarizer or a liquid crystal coating-type polarizer. The film-type polarizer may include a stretched synthetic resin film, and the liquid crystal coating-type polarizer may include liquid crystals arranged in an array. Each of the retarder and the polarizer may further include a protective film. The protective film of each of the retarder and the polarizer may be defined as a base layer of the anti-reflective member.

According to an embodiment, the anti-reflective member may include a black matrix and color filters. The color filters may be arranged considering the color of light emitted from each one of the pixels P of the display panel 10. According to an embodiment, the anti-reflective member may include a destructive interference structure. The destructive interference structure may include a first reflective layer and a second reflective layer which are in different layers from each other. First reflected light and second reflected light, which are respectively reflected from the first reflective layer and the second reflective layer, may destructively interfere with each other. Thus, reflectance of external light may be reduced.

The optical functional layer 50 may include a lens layer. The lens layer may improve light emission efficiency of light emitted from the display panel 10, or may reduce color deviation. The lens layer may include a layer having a concave or convex lens shape, or/and may include a plurality of layers having different refractive indices from each other. The optical functional layer 50 may include either or both of the anti-reflective member and the lens layer described above.

According to an embodiment, the optical functional layer 50 may be continuously provided or formed after a process of forming the display panel 10 and/or the input sensing layer 40. In this case, an adhesive layer may not be respectively between the optical functional layer 50, the display panel 10 and/or the input sensing layer 40.

Each of the display panel 10, the input sensing layer 40 and/or the optical functional layer 50 may include an opening area (e.g., a hole or a through hole) defined therein. In this regard, FIG. 2A illustrates that the display panel 10, the input sensing layer 40 and the optical functional layer 50 include openings 10H, 40H, and 50H, respectively, and the openings 10H, 40H, and 50H overlap each other such as to be aligned with each other along the thickness direction. The openings 10H, 40H and 50H may be positioned to correspond to the second area OA.

According to an embodiment, one or more of the display panel 10, the input sensing layer 40 and the optical functional layer 50 may not include an opening area. In an embodiment, for example, at least one of the display panel 10, the input sensing layer 40 and the optical functional layer 50 may not include an opening area. Alternatively, as illustrated in FIG. 2B, the display panel 10, the input sensing layer 40 and the optical functional layer 50 may each exclude an opening area.

The second area OA may be a component area (e.g., a sensor area, a camera area, a speaker area, etc.) in which a component 20 which provide various functions to the display apparatus 1 is positioned. As illustrated in FIG. 2A, the component 20 may be positioned within the openings 10H, 40H and 50H. Alternatively, as illustrated in FIG. 2B, the component 20 may be below the display panel 10 corresponding to the second area OA.

The component 20 may include an electronic element. The component 20 may include an electronic element using light or sound to provide a function of the display apparatus 1. In an embodiment, for example, the electronic element may include a sensor (e.g., an infrared sensor) that outputs and/or receives light, a camera that receives light to capture an image, a sensor that measures a distance of an input relative to the display apparatus 1 or recognizes a fingerprint by outputting and sensing light or sound, a small lamp that outputs light, a speaker that outputs sound, and the like. An electronic element using light may use light of various wavelength bands such as visible light, infrared light and ultraviolet light. According to an embodiment, the second area OA may be understood as a transmission area through which light or/and sound that is output from the component 20 to outside the display apparatus 1 or travels from outside the display apparatus 1 toward the electronic element may be transmitted.

According to an embodiment, when the display apparatus 1 is used as a smart watch or a dashboard for a vehicle, the component 20 may include a member including a clock hand or a needle indicating information (e.g., vehicle velocity, etc.). When the display apparatus 1 includes a clock hand or a dashboard for a vehicle, the component 20 may be exposed to outside the display apparatus 1 through the window 60, and the window 60 may include an opening area corresponding to the second area OA.

The component 20 may include element(s) related to the functions of the display panel 10 as described above, or may include element(s) such as accessories that increase the sense of beauty of the display panel 10. Although not illustrated in FIGS. 2A and 2B, an optical clear adhesive or the like may be between the window 60 and the optical functional layer 50.

FIGS. 3A(1) to 3D are schematic cross-sectional views of embodiments of a display apparatus 1. FIG. 3A(2) is an enlarged view of portion B of FIG. 3A(1). The layered structure in FIG. 3A(1) may correspond to the display panel 10, without being limited thereto.

Referring to FIG. 3A(1), the display apparatus 1 may include a display layer 200 on a substrate 100. The substrate 100 may include a glass material or a polymer resin. The substrate 100 may include or be formed with multiple layers. Referring to FIG. 3A(2), for example, the substrate 100 may include a first base layer 101, a first barrier layer 102, a second base layer 103 and a second barrier layer 104 in order toward the display layer 200.

Each of the first base layer 101 and the second base layer 103 may include a polymer resin. In an embodiment, for example, each of the first base layer 101 and the second base layer 103 may include a polymer resin such as polyethersulfone, polyarylate, polyether imide, polyethylene naphthalate, polyethylene terephthalate, polyphenylene sulfide, polyimide, polycarbonate, cellulose triacetate or cellulose acetate propionate. The above-described polymer resin may be transparent.

The first barrier layer 102 and the second barrier layer 104 are barrier layers that reduce or effectively prevent infiltration of an external foreign matter. The first barrier layer 102 and the second barrier layer 104 may include a single layer or multiple layers including an inorganic material such as silicon nitride ($SiN_x$) or silicon oxide ($SiO_x$).

The display layer 200 may include pixels P or elements that define the pixels P. The display layer 200 may include a display element layer 200A including display elements arranged for each of the pixels P, and a pixel circuit layer 200B including a pixel circuit PC and insulating layers arranged for each of the pixels P. Each of the pixel circuit PC may include a thin-film transistor TFT and a storage capacitor Cst, and each display element may include an organic light-emitting diode OLED. The display element layer 200A may be connected to the pixel circuit layer 200B to generate light, to emit light, to display an image, etc.

The display elements of the display layer 200 may be covered with an encapsulation member such as a thin-film encapsulation layer 300. The thin-film encapsulation layer 300 may include at least one inorganic layer and at least one organic layer. When the display apparatus 1 includes the substrate 100 including a polymer resin and the thin-film encapsulation layer 300 including at least one inorganic encapsulation layer and at least one organic encapsulation layer, flexibility of the display apparatus 1 may be improved.

The display apparatus 1 may include an opening 10H passing through a thickness of the display panel 10. The opening 10H may be positioned in the second area OA. In this case, the second area OA may be an opening area. FIG. 3A(1) illustrates that the substrate 100 and the thin-film encapsulation layer 300 include a first through hole 100H and a second through hole 300H corresponding to the opening 10H of the display panel 10, respectively. The display layer 200 may also include a third through hole 200H corresponding to the second area OA. The third through hole 200H may be extended through a thickness of the display element layer 200A and a thickness of the pixel circuit layer 200B.

Figure 3B:
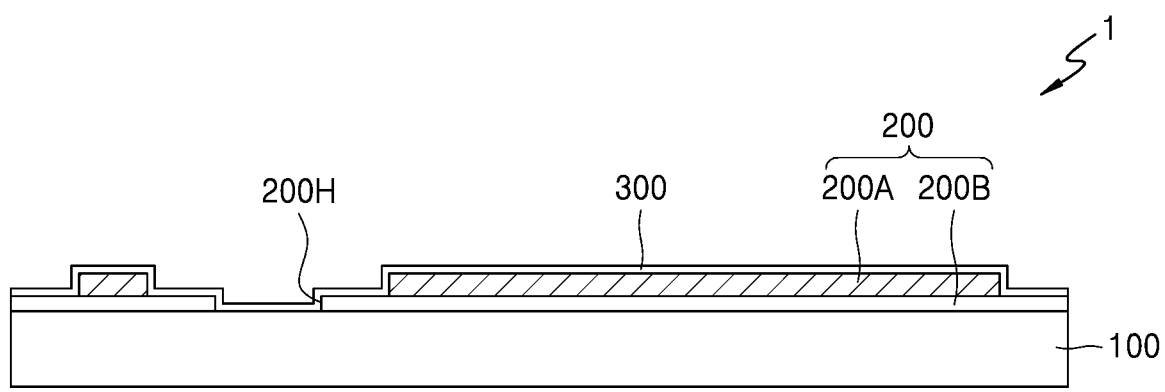
FIGS. 3A(1) to 3D are schematic cross-sectional views of embodiments of a display apparatus.
Figure 3B:
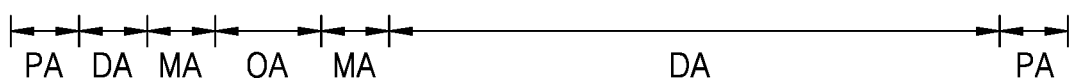

According to an embodiment, as illustrated in FIG. 3B, the substrate 100 may not include a through hole corresponding to the second area OA, the display layer 200 may include a third through hole 200H corresponding to the second area OA, and the thin-film encapsulation layer 300 may not include a through hole corresponding to the second area OA. At the second area OA, a solid portion of the substrate 100 and a solid portion of the thin-film encapsulation layer 300 may be disposed extending across the third through hole 200H in a direction along the substrate 100.

Figure 3C:
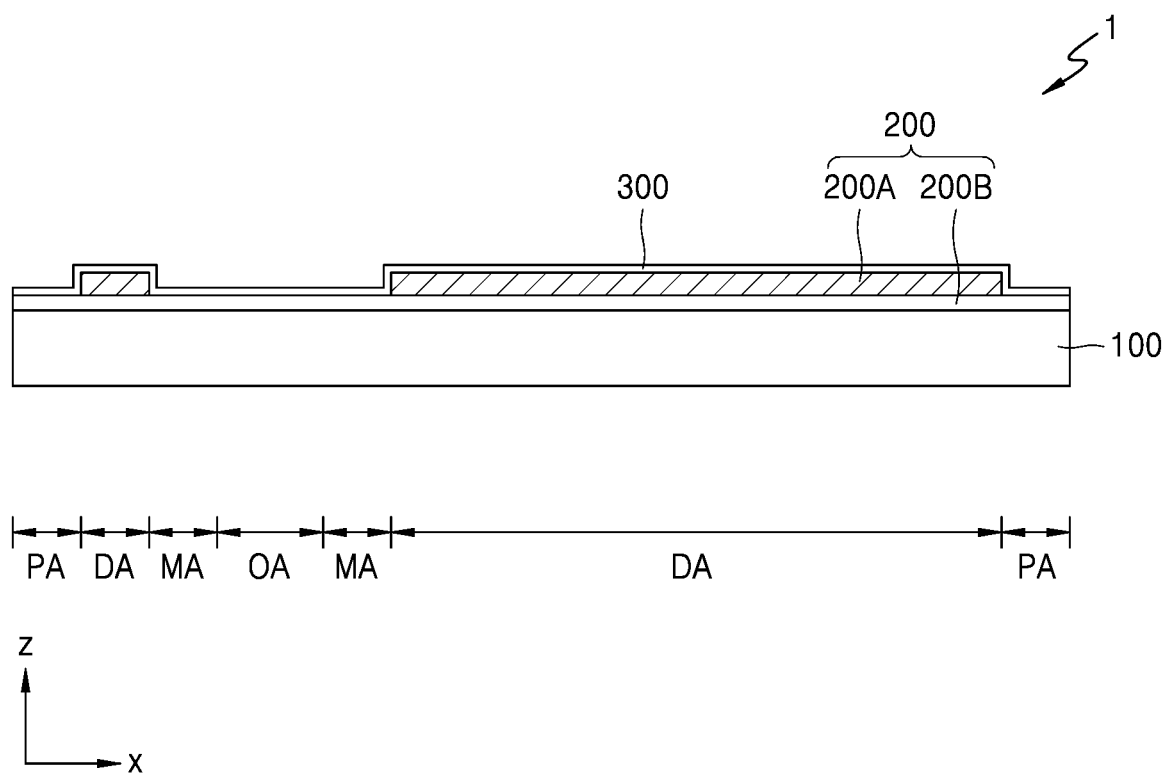

According to an embodiment, as illustrated in FIG. 3C, the display layer 200 may not include a third through hole 200H in the pixel circuit layer 200B and corresponding to the second area OA, and the display element layer 200A may be excluded from the second area OA.

Figure 3D:
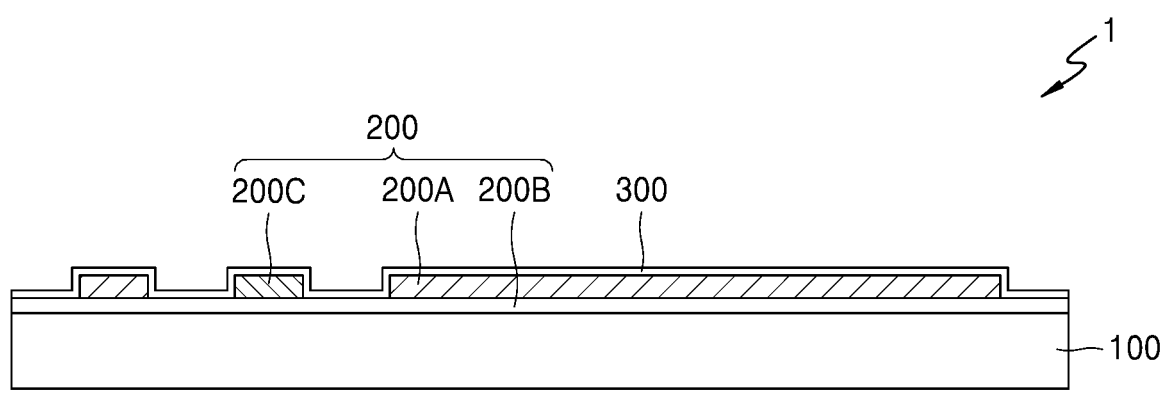

Although FIGS. 3A(1) to 3C illustrate that the display element layer 200A is excluded from the second area OA, the disclosure is not limited thereto. According to an embodiment, as illustrated in FIG. 3D, an auxiliary display element layer 200C (e.g., auxiliary display element pattern) may be arranged in the second area OA. The auxiliary display element layer 200C may include a display element having the same structure as the display element of the display element layer 200A and operating in the same manner as the display element of the display element layer 200A, however, is not limited thereto. In an embodiment, the auxiliary display element layer 200C may include a display element having a structure different from the display element of the display element layer 200A and operating in a manner different from the display element of the display element layer 200A. Each of the auxiliary display element layer 200C and the display element layer 200A may face the substrate 100 with the pixel circuit layer 200B therebetween. The auxiliary display element layer 200C and the display element layer 200A may be in a same layer as each other.

According to an embodiment, pixels P of the display element layer 200A may include active organic light-emitting diodes, and pixels P of the auxiliary display element layer 200C may include passive organic light-emitting diodes. When the auxiliary display element layer 200C includes a passive organic light-emitting diode as a display element, elements constituting a pixel circuit PC may not be present below the passive organic light-emitting diode. In an embodiment, for example, a portion of the pixel circuit layer 200B below the auxiliary display element layer 200C may not include a thin-film transistor TFT and a storage capacitor Cst of a pixel circuit PC.

According to an embodiment, the auxiliary display element layer 200C may include a display element (e.g., an active organic light-emitting diode) having the same type as the display element layer 200A, but the structure of the pixel circuit PC therebelow may be different. In an embodiment, for example, the pixel circuit below the auxiliary display element layer 200C (e.g., a pixel circuit PC having a light shielding member between the substrate 100 and the thin-film transistor TFT) may have a structure different from that of the pixel circuit PC below the display element layer 200A. Alternatively, the display elements of the auxiliary display element layer 200C may operate according to a control signal different from that of the display elements of the display element layer 200A. A component 20 that does not require a relatively high transmittance (e.g., an infrared sensor) may be arranged in the second area OA in which the auxiliary display element layer 200C is arranged. That is, the auxiliary display element layer 200C may correspond to the component 20. In this case, the second area OA may be understood as a component area and an auxiliary display area.

FIGS. 4A to 4D are schematic cross-sectional views of embodiments of a display apparatus 1.

While the display apparatus 1 described above with reference to FIGS. 3A(1) to 3D includes the thin-film encapsulation layer 300, the display apparatus 1 of FIGS. 4A to 4D includes an encapsulation substrate 300A and a sealant 340.

According to an embodiment, the encapsulation substrate 300A may be arranged to face a substrate 100 and may be bonded to the substrate 100 in a fourth area PA by the sealant 340. Alternatively, the encapsulation substrate 300A may be bonded to the substrate 100 by a sealing member such as a frit.

Figure 4A:
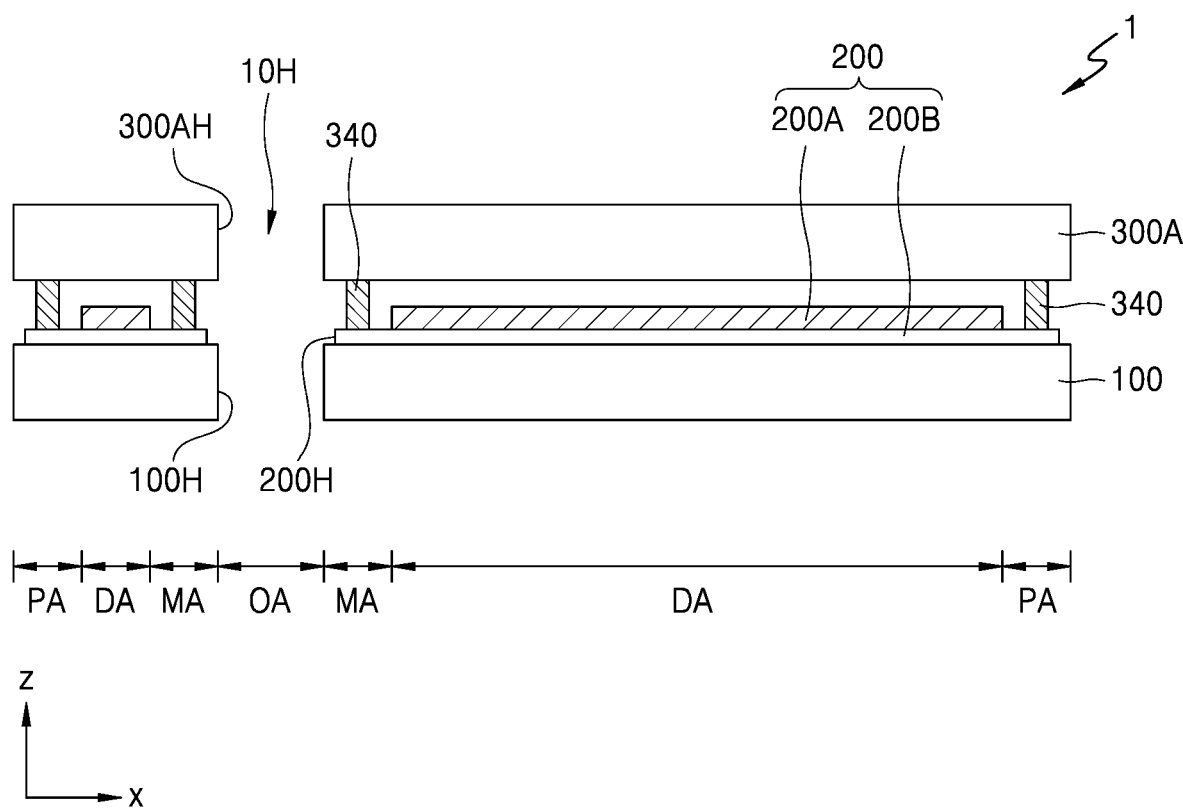
FIGS. 4A to 4D are schematic cross-sectional views of embodiments of a display apparatus.
Figure 4B:
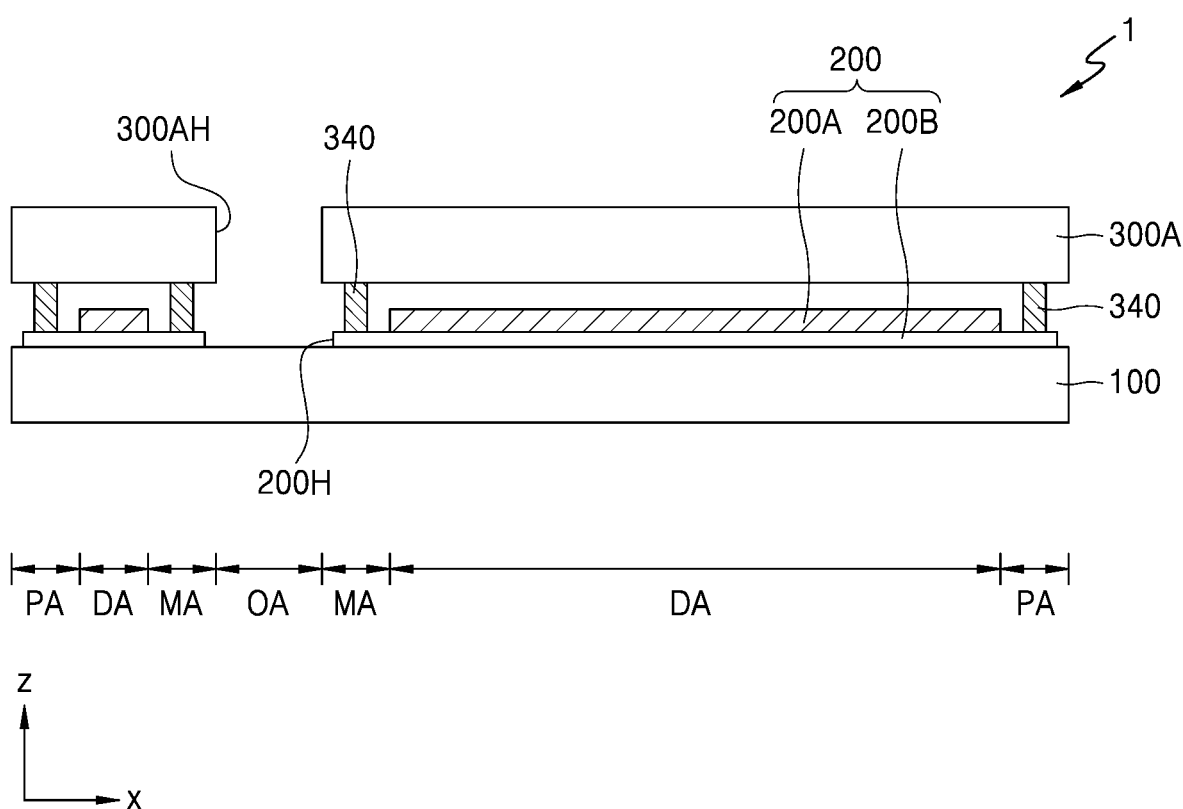

As illustrated in FIG. 4A, the substrate 100, a display layer 200 and the encapsulation substrate 300A may respectively include a first through hole 100H, a third through hole 200H and a fourth through hole 300AH each corresponding to a second area OA. According to an embodiment, as illustrated in FIG. 4B, the substrate 100 may not include the first through hole 100H corresponding to the second area OA.

Figure 4C:
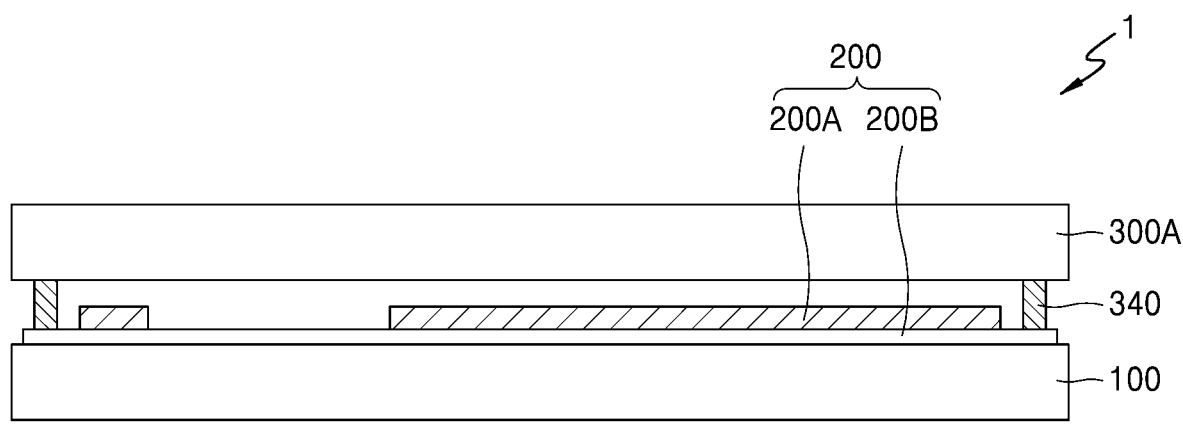
Figure 4D:
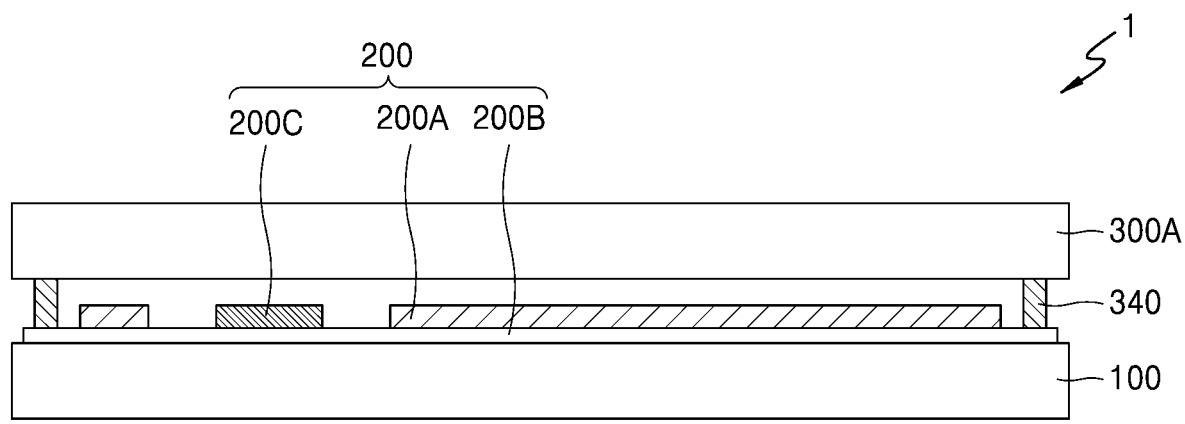

According to an embodiment, as illustrated in FIG. 4C, the display layer 200 may not include a third through hole 200H in the pixel circuit layer 200B and corresponding to the second area OA. A display element layer 200A may not be arranged in the second area OA, or an auxiliary display element layer 200C may be arranged as illustrated in FIG. 4D. The auxiliary display element layer 200C is the same as described above with reference to FIG. 3D.

Figure 5:
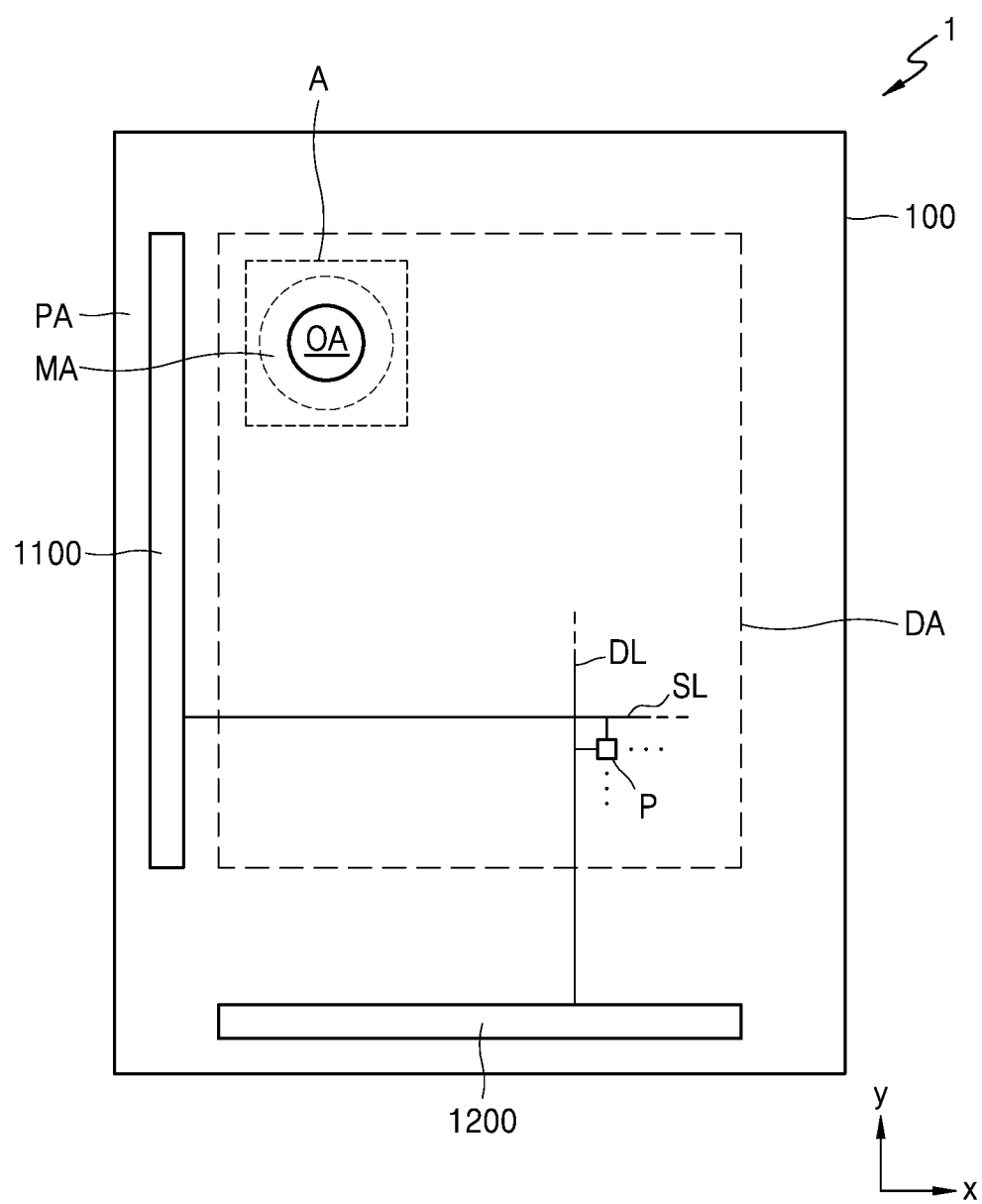
FIG. 5 is a schematic plan view of an embodiment of a display apparatus.
Figure 6:
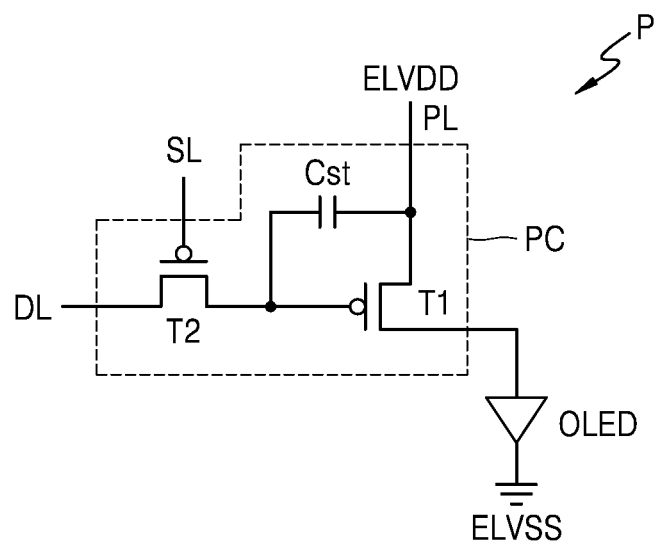
FIG. 6 is a schematic equivalent circuit diagram of an embodiment of a pixel in a display apparatus.
Figure 7:
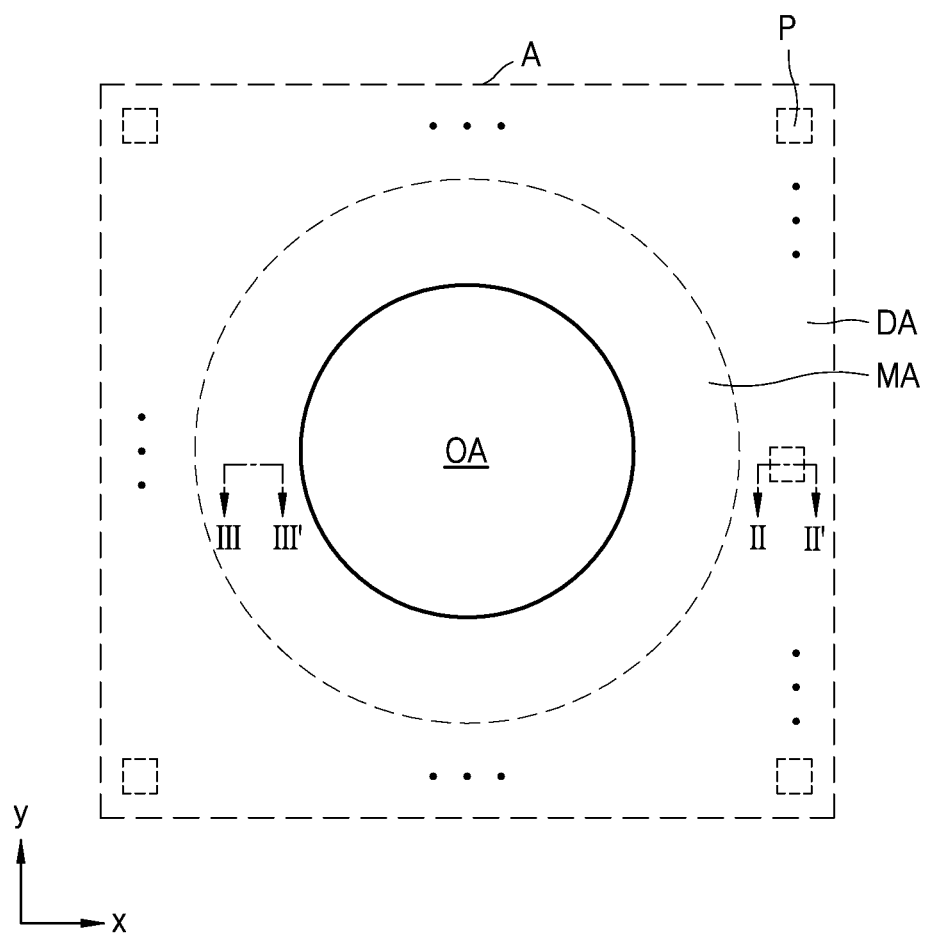
FIG. 7 is an enlarged plan view of portion A of FIG. 5.

FIG. 5 is a schematic plan view of an embodiment of a display apparatus 1, FIG. 6 is a schematic equivalent circuit diagram of an embodiment of a pixel P in the display apparatus 1 and FIG. 7 is an enlarged view of portion A of FIG. 5.

Referring to FIG. 5, the display apparatus 1 may include a first area DA, a second area OA, a third area MA and a fourth area PA. It may be understood that FIG. 5 illustrates a substrate 100 of the display apparatus 1. In an embodiment, for example, it may be understood that the substrate 100 includes a first area DA, a second area OA, a third area MA and a fourth area PA.

The display apparatus 1 may include a pixel P provided in plural including pixels P in the first area DA. As illustrated in FIG. 6, each of the pixels P may include a pixel circuit PC and an organic light-emitting diode OLED as a display element which is connected to the pixel circuit PC. The pixel circuit PC may include a first thin-film transistor T1, a second thin-film transistor T2, and a storage capacitor Cst. Each of the pixels P may emit red light, green light or blue light through the organic light-emitting diode OLED, or may emit red light, green light, blue light or white light through the organic light-emitting diode OLED.

The second thin-film transistor T2 acts as a switching thin-film transistor. The second thin-film transistor T2 may be connected to a scan line SL and a data line DL and may transmit a data voltage input from the data line DL to the first thin-film transistor T1, based on a switching voltage input from the scan line SL. The storage capacitor Cst may be connected to the second thin-film transistor T2 and a driving voltage line PL and may store a voltage corresponding to a difference between a voltage received from the second thin-film transistor T2 and a first power supply voltage ELVDD supplied to the driving voltage line PL.

The first thin-film transistor T1 acts as a driving thin-film transistor. The first thin-film transistor T1 may be connected to the driving voltage line PL and the storage capacitor Cst and may control an electrical driving current flowing from the driving voltage line PL through the organic light-emitting diode OLED in response to a voltage value stored in the storage capacitor Cst. The organic light-emitting diode OLED may emit light having a luminance according to the electrical driving current. An opposite electrode 230 (e.g., a cathode) of the organic light-emitting diode OLED may receive a second power supply voltage ELVSS.

Although FIG. 6 illustrates that the pixel circuit PC includes two thin-film transistors and one storage capacitor, the disclosure is not limited thereto. The number of thin-film transistors and the number of storage capacitors may be variously changed according to the design of the pixel circuit PC. In an embodiment, for example, the pixel circuit PC may further include, in addition to the two thin-film transistors, four or more thin-film transistors.

Referring back to FIGS. 5 and 7, the third area MA may surround the second area OA in a plan view. The third area MA is a planar area in which a display element such as an organic light-emitting diode OLED which emits light is not arranged. In the third area MA, signal lines (not illustrated) through which signals are provided to the pixels P may be arranged around the second area OA. In the fourth area PA, a scan driver 1100 which provides a scan signal to each of the pixels P, a data driver 1200 which provides a data signal to each of the pixels P, and main power lines (not illustrated) which provide a first power supply voltage ELVDD (in FIG. 6) and a second power supply voltage ELVSS (in FIG. 6) may be arranged.

Although FIG. 5 illustrates that the data driver 1200 is arranged adjacent to one side of the substrate 100, the data driver 1200 may be arranged on a flexible printed circuit board ("FPCB") electrically connected to a pad on one side of the display apparatus 1.

Figure 8:
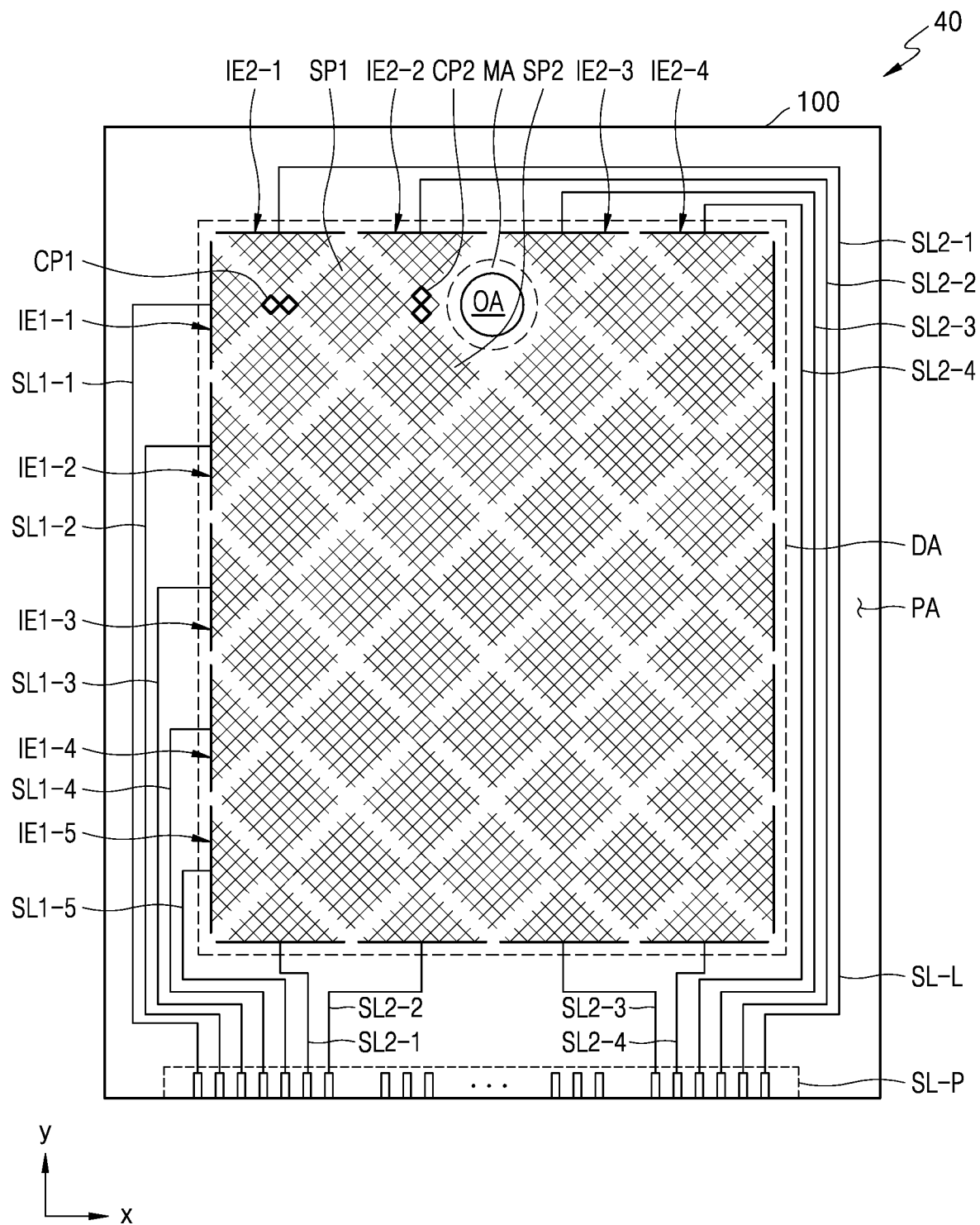
FIG. 8 is a plan view of an embodiment of an input sensing layer provided in a display apparatus.

FIG. 8 is a plan view of an embodiment of an input sensing layer 40 provided in a display apparatus 1.

Referring to FIG. 8, the input sensing layer 40 may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

Figure 9:
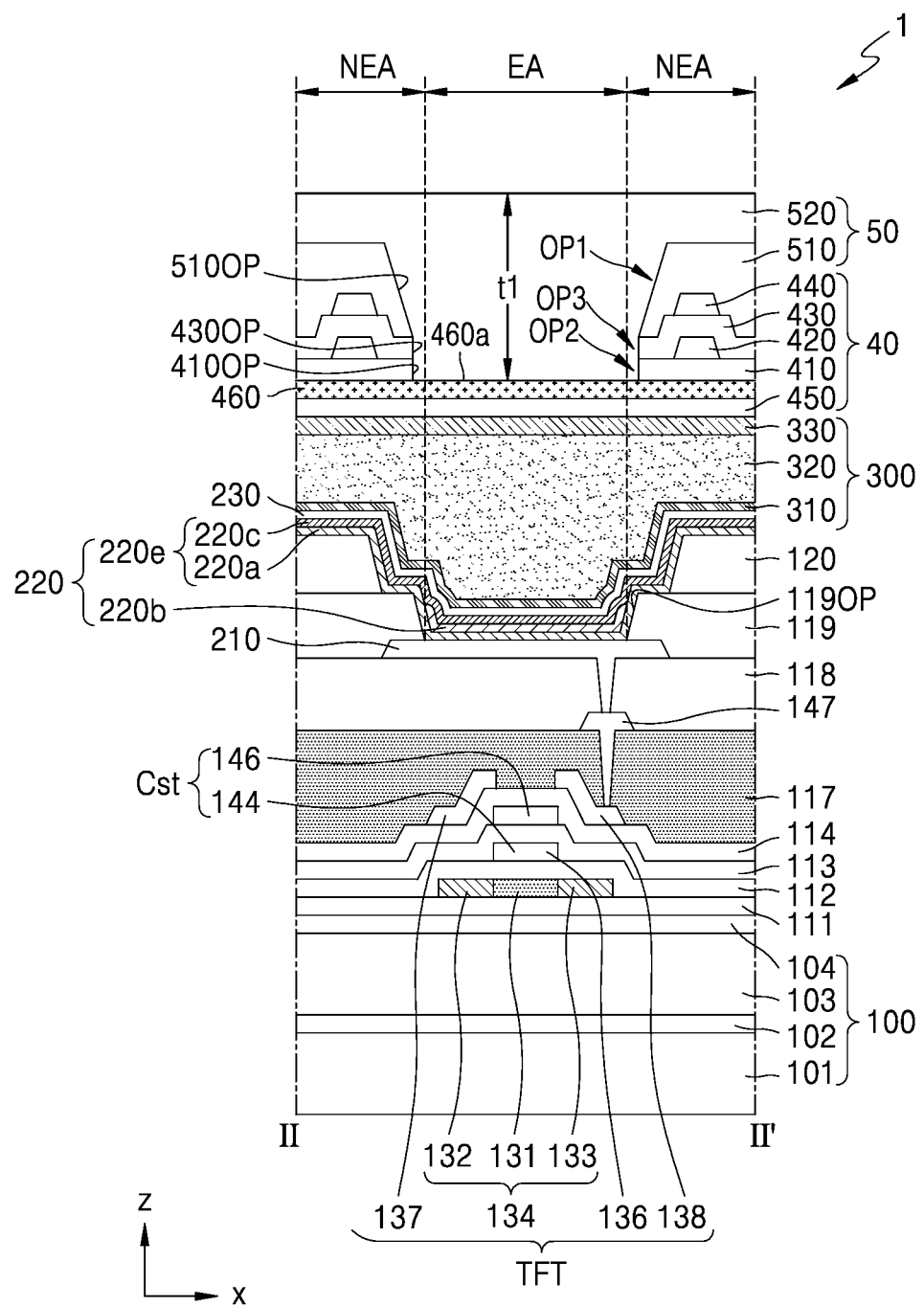
FIG. 9 is a schematic cross-sectional view of an embodiment of a display apparatus.

According to an embodiment, the input sensing layer 40 may form the first sensing electrodes IE1-1 to IE1-5 from a first conductive layer 420 (in FIG. 9), and may form the second sensing electrodes IE2-1 to IE2-4 from a second conductive layer 440 (in FIG. 9). However, the disclosure is not limited thereto, and various modifications may be made thereto. In an embodiment, for example, the second sensing electrodes IE2-1 to IE2-4 may include be formed from the first conductive layer 420 (in FIG. 9), and the first sensing electrodes IE1-1 to IE1-5 may include or be formed from the second conductive layer 440 (in FIG. 9). FIG. 8 illustrates the first sensing electrodes IE1-1 to IE1-5 and the second sensing electrodes IE2-1 to IE2-4 which each have a mesh shape. According to an embodiment, the first sensing electrodes IE1-1 to IE1-5 and the second sensing electrodes IE2-1 to IE2-4 may have a three-layer structure of titanium/aluminum/titanium.

Although not illustrated, the input sensing layer 40 may further include optical dummy electrodes in boundary regions between the first sensing electrodes IE1-1 to IE1-5 and the second sensing electrodes IE2-1 to IE2-4. In this regard, the input sensing layer 40 may further include first dummy electrodes (not illustrated) including or formed from the first conductive layer 420 (in FIG. 9), and second dummy electrodes (not illustrated) including or formed from the second conductive layer 440 (in FIG. 9).

The first dummy electrodes may be connected to second sensor parts SP2 of the second sensing electrodes IE2-1 to IE2-4 through contact holes. The second dummy electrodes may be connected to first sensor parts SP1 of the first sensing electrodes IE1-1 to IE1-5 through contact holes. The first dummy electrodes and the second dummy electrodes may reduce electrical resistances of the first sensing electrodes IE1-1 to IE1-5 and the second sensing electrodes IE2-1 to IE2-4.

Each of the first sensing electrodes IE1-1 to IE1-5 may include the first sensor parts SP1 and first connection parts CP1. Alternatively, each of the first sensing electrodes IE1-1 to IE1-5 may include at least one of first sensor parts SP1, second sensor parts SP2, first connection parts CP1, and second connection parts CP2. Each of the second sensing electrodes IE2-1 to IE2-4 may include the second sensor parts SP2 and second connection parts CP2. Alternatively, each of the second sensing electrodes IE2-1 to IE2-4 may include at least one of first sensor parts SP1, second sensor parts SP2, first connection parts CP1, and second connection parts CP2.

Although FIG. 8 illustrates that the first sensing electrodes IE1-1 to IE1-5 and the second sensing electrodes IE2-1 to IE2-4 have a pattern of a specific shape, the shape thereof is not limited. According to an embodiment, although FIG. 8 illustrates that the first sensor parts SP1 and the second sensor parts SP2 have a rhombus shape, the disclosure is not limited thereto. According to an embodiment, the first sensor parts SP1 and the second sensor parts SP2 may have various polygonal shapes in a plan view. According to an embodiment, the first sensing electrodes IE1-1 to IE1-5 and the second sensing electrodes IE2-1 to IE2-4 have a shape (e.g., a bar shape) without distinction between the sensor part and the connection part.

The first sensor parts SP1 may be arranged along a first direction (e.g., the x direction) in one first sensing electrode, and the second sensor parts SP2 may be arranged along a second direction which crosses the first direction (e.g., the y direction) in one second sensing electrode. Each of the first connection parts CP1 may connect the first sensor parts SP1 adjacent to each other, and each of the second connection parts CP2 may connect the second sensor parts SP2 adjacent to each other. Also, various modifications may be made thereto. In an embodiment, for example, each of the first connection parts CP1 may connect the second sensor parts SP2, and each of the second connection parts CP2 may connect the first sensor parts SP1.

Each of the first signal lines SL1-1 to SL1-5 may be connected to one end of each of the first sensing electrodes IE1-1 to IE1-5, respectively. Each of the second signal lines SL2-1 to SL2-4 may be connected to both of opposing ends of each of the second sensing electrodes IE2-1 to IE2-4, respectively. According to an embodiment, each of the first signal lines SL1-1 to SL1-5 may be connected to both of opposing ends of each of the first sensing electrodes IE1-1 to IE1-5, respectively. According to an embodiment, each of the second signal lines SL2-1 to SL2-4 may be connected to one end of each of the second sensing electrodes IE2-1 to IE2-4, respectively.

Sensing sensitivity may be improved as compared with the input sensing layer 40 including the second signal lines SL2-1 to SL2-4 each connected to only one end of the second sensing electrodes IE2-1 to IE2-4, respectively. Since the second sensing electrodes IE2-1 to IE2-4 are longer than the first sensing electrodes IE1-1 to IE1-5, a voltage drop occurs in a detection signal (or a transmission signal), and thus sensing sensitivity may deteriorate. According to an embodiment, since the detection signal (or the transmission signal) is provided through the second signal lines SL2-1 to SL2-4 connected to both of opposing ends of the second sensing electrodes IE2-1 to IE2-4, deterioration in sensing sensitivity is reduced or effectively prevented by reducing or effectively preventing a voltage drop in the detection signal (or the transmission signal).

According to an embodiment, the first signal lines SL1-1 to SL1-5 and the second signal lines SL2-1 to SL2-4 may include a line part SL-L and a pad part SL-P.

According to an embodiment, the first sensing electrodes IE1-1 to IE1-5 and the second sensing electrodes IE2-1 to IE2-4 may each have a mesh shape. Since the first sensing electrodes IE1-1 to IE1-5 and the second sensing electrodes IE2-1 to IE2-4 have a mesh shape, parasitic capacitance with the opposite electrode may be reduced. A mesh shape may be defined by solid portions spaced apart from each other to form mesh openings respectively between the solid portions.

The first sensing electrodes IE1-1 to IE1-5 which are mesh-shaped and the second sensing electrodes IE2-1 to IE2-4 which are mesh-shaped may include a material such as silver, aluminum, copper, chromium, nickel, titanium or the like, which may be processed at a low temperature, but the disclosure is not limited thereto. Even when the input sensing layer 40 is provided or formed through a continuous process, damage to the organic light-emitting diode OLED may be reduced or effectively prevented.

FIG. 9 is a schematic cross-sectional view of an embodiment of a display apparatus 1. FIG. 9 is a cross-sectional view of the display apparatus 1 taken along line II-II' of FIG. 7.

Hereinafter, the configuration of the display apparatus 1 will be described in detail according to the stacking order with reference to FIG. 9.

Referring to FIG. 9, a substrate 100 may include an insulating material such as a polymer resin. The substrate 100 may include a flexible substrate that is bendable, foldable or rollable.

According to an embodiment, the substrate 100 may include a first base layer 101, a first barrier layer 102, a second base layer 103 and a second barrier layer 104, which are sequentially stacked.

Each of the first base layer 101 and the second base layer 103 may include a polymer resin having high heat resistance. In an embodiment, for example, each of the first base layer 101 and the second base layer 103 may include at least one material selected from polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate and polyarylene ether sulfone. In particular, each of the first base layer 101 and the second base layer 103 may include polyimide. Each of the first barrier layer 102 and the second barrier layer 104 may include one of silicon nitride ($SiN_x$), silicon oxide ($SiO_x$), aluminum oxide ($Al_2O_3$) and zirconium oxide ($Zr_2O_3$). The first barrier layer 102 and the second barrier layer 104 may reduce or effectively prevent infiltration of ambient air.

A buffer layer 111 may be positioned on the substrate 100 and may reduce or prevent infiltration of a foreign material, moisture or ambient air from below the substrate 100 and may provide a flat surface on the substrate 100. The buffer layer 111 may include an inorganic material such as oxide or nitride, an organic material, or an organic-inorganic composite, and may have a single-layer or multilayer structure including an inorganic material and an organic material. According to an embodiment, the buffer layer 111 may include silicon oxide ($SiO_X$) or silicon nitride ($SiN_X$). According to an embodiment, the buffer layer 111 may be provided by stacking silicon oxide ($SiO_X$) or silicon nitride ($SiN_X$).

A thin-film transistor TFT and a storage capacitor Cst may be on the buffer layer 111. The thin-film transistor TFT may include a semiconductor layer 134, a gate electrode 136, a source electrode 137 and a drain electrode 138, and the storage capacitor Cst may include a lower electrode 144 and an upper electrode 146.

The semiconductor layer 134 may be on the buffer layer 111 and may include polysilicon. According to an embodiment, the semiconductor layer 134 may include amorphous silicon. According to an embodiment, the semiconductor layer 134 may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti) and zinc (Zn). The semiconductor layer 134 may include a channel region 131, and a source region 132 and a drain region 133 each doped with impurities.

A first gate insulating layer 112 may be arranged to cover the semiconductor layer 134. The first gate insulating layer 112 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$) or zinc oxide ("ZnO"). The first gate insulating layer 112 may include a single layer or multiple layers including the above-described inorganic insulating material.

The gate electrode 136 may be arranged on the first gate insulating layer 112 to overlap the semiconductor layer 134. The gate electrode 136 may include molybdenum (Mo), aluminum (Al), copper (Cu), titanium (Ti) and the like, and may include a single layer or multiple layers. According to an embodiment, the gate electrode 136 may include a single molybdenum (Mo) layer.

The second gate insulating layer 113 may be arranged to cover the gate electrode 136. The second gate insulating layer 113 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$) or zinc oxide ("ZnO"). The second gate insulating layer 113 may include a single layer or multiple layers including the above-described inorganic insulating material.

The upper electrode 146 of the storage capacitor Cst may be on the second gate insulating layer 113. The upper electrode 146 may overlap or correspond to the gate electrode 136 therebelow. The gate electrode 136 and the upper electrode 146 overlapping each other with the second gate insulating layer 113 therebetween may constitute the storage capacitor Cst. According to an embodiment, the gate electrode 136 may define the lower electrode 144 of the storage capacitor Cst. According to an embodiment, the lower electrode 144 of the storage capacitor Cst may be provided as a separate element that is apart from the gate electrode 136 of the thin-film transistor TFT.

The upper electrode 146 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu), and may include a single layer or multiple layers including the above-described material.

An interlayer insulating layer 114 may be arranged to cover the upper electrode 146. The interlayer insulating layer 114 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$) or zinc oxide ("ZnO").

The source electrode 137 and the drain electrode 138 may be on the interlayer insulating layer 114. Each of the source electrode 137 and the drain electrode 138 may include a conductive material including molybdenum (Mo), aluminum (Al), copper (Cu), titanium (Ti) and the like, and may include a single layer or multiple layers including the above-described material. According to an embodiment, each of the source electrode 137 and the drain electrode 138 may have a multilayer structure of titanium (Ti)/aluminum (AD/titanium (Ti).

A first planarization layer 117 and a second planarization layer 118 may be sequentially arranged on the source electrode 137 and the drain electrode 138. Each of the first planarization layer 117 and the second planarization layer 118 may include an organic material or an inorganic material, and may have a single-layer structure or a multilayer structure. Each of the first planarization layer 117 and the second planarization layer 118 may include a general-purpose polymer (e.g., benzocyclobutene ("BCB"), polyimide, hexamethyldisiloxane ("HMDSO"), polymethylmethacrylate ("PMMA") or polystyrene ("PS")), a polymer derivative having a phenol-based group, an acrylic polymer, an imide-based polymer, an aryl ether-based polymer, an amide-based polymer, a fluorine-based polymer, a p-xylene-based polymer or a vinyl alcohol-based polymer. Each of the first planarization layer 117 and the second planarization layer 118 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ("ZnO"). When the first planarization layer 117 and the second planarization layer 118 are provided or formed, chemical and mechanical polishing may be performed on the top surface thereof so as to provide flat upper surfaces after the formation of the first planarization layer 117 and the second planarization layer 118.

A contact electrode 147 may be on the first planarization layer 117, and a pixel electrode 210 may be on the second planarization layer 118. The pixel electrode 210 may be electrically connected to the thin-film transistor TFT through the contact electrode 147.

A display element may be on the second planarization layer 118. The display element may be an organic light-emitting diode OLED including a pixel electrode 210, an intermediate layer 220 and an opposite electrode 230.

The pixel electrode 210 may include conductive oxide such as indium tin oxide ("ITO"), indium zinc oxide ("IZO"), zinc oxide ("ZnO"), indium oxide ($In_2O_3$), indium gallium oxide ("IGO") or aluminum zinc oxide ("AZO"). The pixel electrode 210 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any compound thereof. In an embodiment, for example, the pixel electrode 210 may have a structure including layers including ITO, IZO, ZnO, or $In_2O_3$ above and/or below the reflective layer. In this case, the pixel electrode 210 may have a structure in which ITO/Ag/ITO are sequentially stacked.

A pixel defining layer 119 that is on the second planarization layer 118 covers an edge of the pixel electrode 210 and defines an opening 119OP which exposes at least a portion of the pixel electrode 210 to outside the pixel defining layer 119. An emission area EA of the organic light-emitting diode OLED may be defined by the opening 119OP provided in the pixel defining layer 119. The periphery of the emission area EA is a non-emission area NEA, and the non-emission area NEA may surround the emission area EA. That is, the display element may include the emission area EA and the non-emission area NEA which is adjacent to the emission area EA. According to an embodiment, the display element may include the emission area EA and the non-emission area NEA around the emission area EA.

The pixel defining layer 119 may reduce or effectively prevent an electric arc or the like from occurring at the edge of the pixel electrode 210 by increasing the distance between the edge of the pixel electrode 210 and the opposite electrode 230 which is on the pixel electrode 210. The pixel defining layer 119 may be provided or formed through spin coating or the like by using an organic insulating material such as polyimide, polyamide, acrylic resin, benzocyclobutene, hexamethyldisiloxane ("HMDSO"), and phenol resin.

A spacer 120 may be further provided on the pixel defining layer 119 so as to reduce or effectively prevent a mask dent. The spacer 120 may be integral with the pixel defining layer 119. In an embodiment, for example, the spacer 120 and the pixel defining layer 119 may be simultaneously provided or formed in the same process by using a halftone mask.

The intermediate layer 220 may be on the pixel electrode 210. The intermediate layer 220 may include an organic functional layer 220e including a first functional layer 220a and a second functional layer 220c, and an emission layer 220b.

The emission layer 220b may be arranged in the opening 119OP of the pixel defining layer 119 so as to correspond to the pixel electrode 210. The emission layer 220b may include a polymer organic material or a low molecular weight organic material, and may generate and/or emit red light, green light, blue light, or white light.

The organic functional layer 220e may be above and/or below the emission layer 220b. The organic functional layer 220e may include the first functional layer 220a and/or the second functional layer 220c. In an embodiment, the first functional layer 220a or the second functional layer 220c may be omitted.

The first functional layer 220a may be below the emission layer 220b. The first functional layer 220a may include a single layer or multiple layers including an organic material. The first functional layer 220a may include a hole transport layer ("HTL") having a single layer structure. Alternatively, the first functional layer 220a may include a hole injection layer ("HIL") and a hole transport layer ("HTL"). The first functional layer 220a may be integrally formed so as to correspond to each of a plurality of the organic light-emitting diodes OLED in the first area DA (in FIG. 1).

The second functional layer 220c may be on the emission layer 220b. The second functional layer 220c may include a single layer or multiple layers including an organic material. The second functional layer 220c may include an electron transport layer ("ETL") and/or an electron injection layer ("EIL"). The second functional layer 220c may be integrally formed so as to correspond to each of the organic light-emitting diodes OLED in the first area DA (in FIG. 1).

The opposite electrode 230 may be on the second functional layer 220c. That is, the display element includes a first electrode, an organic functional layer 220e and a second electrode in order from the substrate 100. The opposite electrode 230 may include a conductive material having a low work function. In an embodiment, for example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or any alloy thereof. Alternatively, the opposite electrode 230 may further include a layer such as ITO, IZO, ZnO, or $In_2O_3$ on the (semi)transparent layer including the above-described material. The opposite electrode 230 may be integrally formed so as to correspond to each of the organic light-emitting diodes OLED in the first area DA (in FIG. 1).

A capping layer (not illustrated) including an organic material may be on the opposite electrode 230. The capping layer may be a layer provided to protect the opposite electrode 230 and increase light extraction efficiency. According to an embodiment, the capping layer may include an organic material having a refractive index higher than that of the opposite electrode 230. According to an embodiment, the capping layer may include an inorganic material.

A thin-film encapsulation layer 300 may be arranged to cover the organic light-emitting diode OLED. That is, the organic light-emitting diode OLED may be sealed by the thin-film encapsulation layer 300. The thin-film encapsulation layer 300 may be on the opposite electrode 230. The thin-film encapsulation layer 300 may prevent or reduce infiltration of a foreign matter or external moisture into the organic light-emitting diode OLED.

The thin-film encapsulation layer 300 may include at least one inorganic layer and at least one organic layer. According to an embodiment, the thin-film encapsulation layer 300 may include a first inorganic layer 310, an organic layer 320 and a second inorganic layer 330, which are sequentially stacked. According to an embodiment, the number of organic layers, the number of inorganic layers, and the stacking order may be changed.

Each of the first inorganic layer 310 and the second inorganic layer 330 may include at least one inorganic insulating material selected from silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$) and zinc oxide ("ZnO"), and may be provided or formed by chemical vapor deposition ("CVD") or the like. The organic layer 320 may include a polymer-based material. The polymer-based material may include a silicone-based resin, an acrylic resin, an epoxy resin, polyimide, and polyethylene.

The first inorganic layer 310, the organic layer 320 and the second inorganic layer 330 may be integrally formed with each other to cover the first area DA (in FIG. 1). In an embodiment, the first inorganic layer 310, the organic layer 320 and the second inorganic layer 330 may cover an entirety of the first area DA.

An input sensing layer 40 may be on the thin-film encapsulation layer 300. The input sensing layer 40 may include a first insulating layer 410 and a second insulating layer 430 facing each other. Also, the input sensing layer 40 may include a first conductive layer 420 on the first insulating layer 410, and a second conductive layer 440 between the first insulating layer 410 and the second insulating layer 430. According to an embodiment, the first conductive layer 420 and the second conductive layer 440 may be electrically connected to each other through a contact hole defined in the second insulating layer 430. According to an embodiment, the first conductive layer 420 and the second conductive layer 440 may be the first sensing electrodes IE1-1 to IE1-5 or the second sensing electrodes IE2-1 to IE2-4 described above with reference to FIG. 8.

According to an embodiment, each of the first insulating layer 410 and the second insulating layer 430 may include a single layer or multiple layers including an inorganic material such as silicon nitride ($SiN_x$) or silicon oxide ($SiO_x$).

The input sensing layer 40 may include a third insulating layer 450 below the first insulating layer 410. The third insulating layer 450 may be directly on the second inorganic layer 330 of the thin-film encapsulation layer 300. According to an embodiment, the third insulating layer 450 may include a single layer or multiple layers including an inorganic material such as silicon nitride ($SiN_x$) or silicon oxide ($SiO_x$).

According to an embodiment, a first organic layer 460 may be on the thin-film encapsulation layer 300. The first organic layer 460 may be between the third insulating layer 450 and the first insulating layer 410. According to an embodiment, the first organic layer 460 may be integrally formed so as to correspond to both the emission area EA and the non-emission area NEA. According to an embodiment, the first organic layer 460 may include an organic material. According to an embodiment, the first organic layer 460 may include the same material as that of an organic planarization layer 470 (in FIG. 14) to be described later with reference to FIG. 14, and may be provided or formed by the same process.

The first insulating layer 410 may have an opening 410OP (e.g., a second opening OP2) corresponding to the emission area EA defined by the pixel defining layer 119. The opening 410OP defined in the first insulating layer 410 may at least partially overlap the emission area EA. The opening 410OP defined in the first insulating layer 410 may also at least partially overlap the non-emission area NEA. That is, the size of the opening 410OP defined in the first insulating layer 410 may be greater than the size of the emission area EA. As used herein, the size may include a dimension along the substrate 100, such as along x direction and/or the y direction. A central portion of the opening 410OP defined in the first insulating layer 410 may coincide with a central portion of the emission area EA defined by the pixel defining layer 119. At least a portion of an upper surface 460a of the first organic layer 460 may be exposed outside the first insulating layer 410 through the opening 410OP defined in the first insulating layer 410.

The second insulating layer 430 may have an opening 430OP (e.g., a third opening OP3) corresponding to the emission area EA defined by the pixel defining layer 119. The opening 430OP defined in the second insulating layer 430 may at least partially overlap the emission area EA. The opening 430OP defined in the second insulating layer 430 may at least partially overlap the non-emission area NEA. That is, the size of the opening 430OP defined in the second insulating layer 430 may be greater than the size of the emission area EA. A central portion of the opening 430OP defined in the second insulating layer 430 may coincide with a central portion of the emission area EA defined by the pixel defining layer 119. At least a portion of an upper surface 460a of the first organic layer 460 may be exposed to outside the second insulating layer 430 through the opening 430OP defined in the second insulating layer 430.

An optical functional layer 50 may be on the input sensing layer 40. The optical functional layer 50 may include a first layer 510 and a second layer 520 which is on the first layer 510. The first layer 510 may include an organic material having a first refractive index, and the second layer 520 may include an organic material having a second refractive index.

According to an embodiment, the first layer 510 may be arranged to cover the second conductive layer 440 of the input sensing layer 40. The first layer 510 may protect the second conductive layer 440 of the input sensing layer 40, or may act as an insulating layer that insulates the second conductive layer 440.

Instead of arranging a separate insulating layer on the second conductive layer 440 of the input sensing layer 40, the first layer 510 of the optical functional layer 50 may be used to protect or insulate the second conductive layer 440. Therefore, the number of insulating layers may be reduced, and the process may be simplified.

The first refractive index of the first layer 510 may be in a range of about 1.3 to about 1.6. According to an embodiment, the first refractive index of the first layer 510 may be in a range of about 1.4 to about 1.55. The first layer 510 may include, for example, ethylhexyl acrylate), pentafluoropropyl acrylate, poly(ethylene glycol)dimethacrylate, or ethylene glycol dimethacrylate. According to an embodiment, the first layer 510 may include an acrylic organic material having a refractive index of about 1.5. According to an embodiment, the first layer 510 may include a material that forms the organic layer 320 of the thin-film encapsulation layer 300. According to an embodiment, the first layer 510 may include an epoxy-based organic material. In some cases, the first layer 510 may also include a photocurable material.

The second layer 520 may include a planarization layer having a second refractive index. The second refractive index of the second layer 520 may be in a range of about 1.65 to about 1.85. The second layer 520 may include, for example, polydiarylsiloxane, methyltrimethoxysilane, tetramethoxysilane, or the like. According to an embodiment, the second layer 520 may include an acrylic and/or siloxane-based organic material having a refractive index of about 1.6. According to an embodiment, the second layer 520 may include dispersed particles for high refractive index. Metal oxide particles, such as zinc oxide ($ZnO_x$), titanium oxide ($TiO_2$), zirconium oxide ($ZrO_2$), and barium titanate ($BaTiO_3$), may be dispersed in the second layer 520.

According to an embodiment, the first layer 510 may have an opening 510OP (e.g., a first opening OP1) overlapping the opening 119OP defined in the pixel defining layer 119. A width of the opening 510OP defined in the first layer 510 may be greater than a width of the opening 119OP defined in the pixel defining layer 119. As used herein, the width may include a dimension along the substrate 100, such as along x direction and/or the y direction. The opening 510OP defined in the first layer 510 may correspond to the emission area EA defined by the opening 119OP of the pixel defining layer 119. In an embodiment, for example, the opening 510OP defined in the first layer 510 may at least partially overlap the emission area EA defined by the opening 119OP of the pixel defining layer 119. A width of the opening 510OP defined in the first layer 510 may be greater than a width of the emission area EA defined by the opening 119OP of the pixel defining layer 119.

According to an embodiment, at least a portion of the upper surface 460a of the first organic layer 460 may be exposed to outside the first layer 510 through the opening 510OP defined in the first layer 510. The top surface of the first organic layer 460 may be coplanar with a lower surface of the first insulating layer 410.

At least a portion of the second layer 520 may be arranged in the opening 510OP defined in the first layer 510. That is, at least a portion of the second layer 520 may fill the opening 510OP defined in the first layer 510.

Also, at least a portion of the second layer 520 may be arranged in the opening 410OP defined in the first insulating layer 410 and the opening 430OP defined in the second insulating layer 430. That is, at least a portion of the second layer 520 may fill the opening 410OP defined in the first insulating layer 410 and the opening 430OP defined in the second insulating layer 430. The second layer 520 may extend from the opening 410OP, the opening 430OP and the opening 510OP to outside thereof and along a top surface of the first layer 510.

The second layer 520 may be on the first organic layer 460 at least partially exposed to outside the first layer 510 through the opening 510OP defined in the first layer 510, the opening 410OP defined in the first insulating layer 410, and the opening 430OP defined in the second insulating layer 430. In an embodiment, for example, the second layer 520 may be directly on the upper surface 460a of the first organic layer 460 at least partially exposed. That is, at the emission area EA, the second layer 520 of the optical functional layer 50 is directly on an upper surface 460a of the first organic layer 460 which is closest to the optical functional layer 50.

When the second layer 520 is thick, folding characteristics of the display apparatus 1 may deteriorate or light extraction efficiency may deteriorate.

Since the second layer 520 including an organic material is directly on the upper surface 460a of the first organic layer 460 including an organic material, the spreadability of the second layer 520 may be improved, and thus the thickness of the second layer 520 on the first organic layer 460 may be reduced. The second layer 520 including a hydrophilic organic material is directly on the upper surface 460a of the first organic layer 460 including a hydrophilic organic material, the spreadability of the second layer 520 may be improved, and thus the thickness of the second layer 520 may be reduced. Alternatively, since the second layer 520 including a hydrophobic organic material is directly on the upper surface 460a of the first organic layer 460 including a hydrophobic organic material, the spreadability of the second layer 520 may be improved, and thus the thickness of the second layer 520 on the first organic layer 460 may be reduced. That is, since the second layer 520 and the first organic layer 460 include organic materials having the same properties and the second layer 520 is directly on the upper surface 460a of the first organic layer 460, the spreadability of the second layer 520 may be improved, and thus the second layer 520 may be thinly formed on the first organic layer 460. Therefore, the light extraction efficiency of the display apparatus 1 may be improved and folding characteristics of the display apparatus 1 may also be improved.

According to an embodiment, the second layer 520 may have a thickness t1 of about 15 micrometers (μm) to about 20 μm from the upper surface 460a of the first organic layer 460. The thickness t1 may be a maximum thickness of the second layer 520. When the thickness of the second layer 520 is less than about 15 μm, unfilling may occur and the light extraction efficiency of the display apparatus 1 may deteriorate. When the thickness of the second layer 520 is greater than about 20 μm, the folding characteristics of the display apparatus 1 may deteriorate. Therefore, when the second layer 520 has a thickness t1 of about 15 μm to about 20 μm from the upper surface 460a of the first organic layer 460, the display apparatus 1 may improve the light extraction efficiency and may also have excellent folding characteristics.

Figure 10:
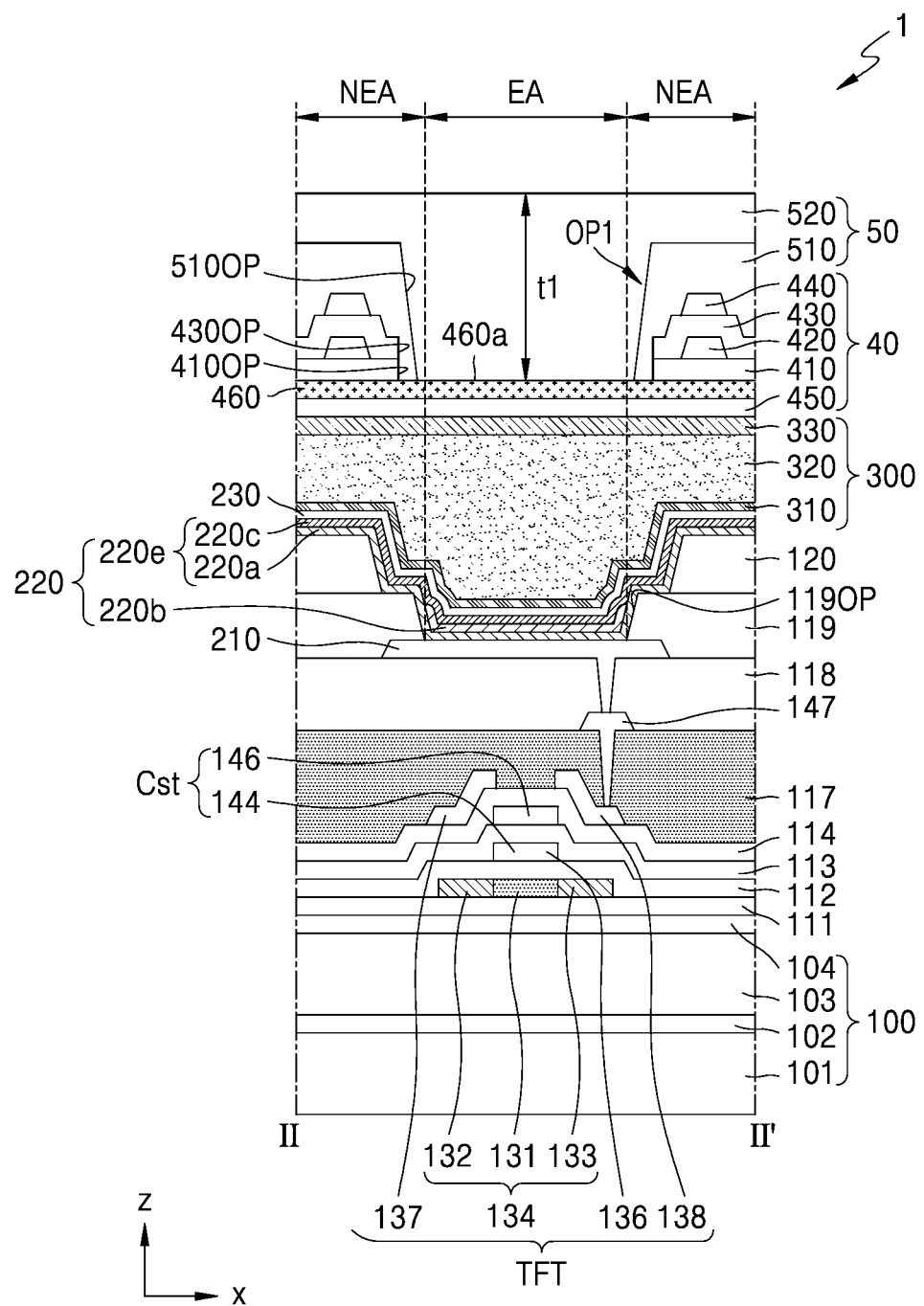
FIG. 10 is a schematic cross-sectional view of an embodiment of a display apparatus.

FIG. 10 is a schematic cross-sectional view of an embodiment of a display apparatus 1. The embodiment of FIG. 10 differs from the embodiment of FIG. 9, in that a first layer 510 covers side surfaces of a first insulating layer 410 and a second insulating layer 430. In FIG. 10, the same reference numerals as those in FIG. 9 denote the same members, and redundant descriptions thereof will be omitted.

Referring to FIG. 10, an input sensing layer 40 may be on a thin-film encapsulation layer 300. The input sensing layer 40 may include a first insulating layer 410 and a second insulating layer 430. Also, the input sensing layer 40 may include a first conductive layer 420 on the first insulating layer 410, and a second conductive layer 440 between the first insulating layer 410 and the second insulating layer 430.

The input sensing layer 40 may include a third insulating layer 450 below the first insulating layer 410. The third insulating layer 450 may be directly on a second inorganic layer 330 of the thin-film encapsulation layer 300.

According to an embodiment, a first organic layer 460 may be on the thin-film encapsulation layer 300. The first organic layer 460 may be between the third insulating layer 450 and the first insulating layer 410. According to an embodiment, the first organic layer 460 may be integrally formed so as to correspond to an emission area EA and a non-emission area NEA. According to an embodiment, the first organic layer 460 may include an organic material. According to an embodiment, the first organic layer 460 may include the same material as that of an organic planarization layer (470 in FIG. 14) to be described later, and may be formed by the same process.

The first insulating layer 410 may have an opening 410OP (e.g., a second opening OP2) corresponding to the emission area EA defined by a pixel defining layer 119. The opening 410OP defined in the first insulating layer 410 may at least partially overlap the emission area EA. At least a portion of an upper surface 460a of the first organic layer 460 may be exposed through the opening 410OP defined in the first insulating layer 410.

The second insulating layer 430 may have an opening 430OP (e.g., a third opening OP3) corresponding to the emission area EA defined by the pixel defining layer 119. The opening 430OP defined in the second insulating layer 430 may at least partially overlap the emission area EA. At least a portion of the upper surface 460a of the first organic layer 460 may be exposed through the opening 430OP defined in the second insulating layer 430.

According to an embodiment, the opening 410OP defined in the first insulating layer 410 and the opening 430OP defined in the second insulating layer 430 may at least partially overlap each other such as to be aligned with each other.

An optical functional layer 50 may be on the input sensing layer 40. The optical functional layer 50 may include a first layer 510 and a second layer 520 which is on the first layer 510.

According to an embodiment, the first layer 510 may be arranged to cover the second conductive layer 440 of the input sensing layer 40. The first layer 510 may protect the second conductive layer 440 of the input sensing layer 40, or may act as an insulating layer that insulates the second conductive layer 440.

According to an embodiment, the first layer 510 may cover the inner surfaces of the first insulating layer 410 at the opening 410OP defined in the first insulating layer 410 and the inner surfaces of the second insulating layer 430 at the opening 430OP defined in the second insulating layer 430. The first layer 510 may cover both opposing side surfaces (e.g., inner surfaces) of the first insulating layer 410 and the second insulating layer 430 which respective define the opening 410OP and the opening 430OP.

According to an embodiment, the first layer 510 may define an opening 510OP (e.g., a first opening OP1) overlapping the opening 119OP defined in the pixel defining layer 119. Since the first layer 510 covers both of opposing sides of the first insulating layer 410 and the second insulating layer 430 at respective open areas thereof, the width of the opening 510OP defined in the first layer 510 may be less than the widths of the opening 410OP defined in the first insulating layer 410 and the opening 430OP defined in the second insulating layer 430.

At least a portion of the second layer 520 may be arranged in the opening 510OP defined in the first layer 510. That is, at least a portion of the second layer 520 may fill the opening 510OP defined in the first layer 510.

The second layer 520 may be on the first organic layer 460 at least partially exposed through the opening 510OP defined in the first layer 510. In an embodiment, for example, the second layer 520 may be directly on the upper surface 460*a* of the first organic layer 460 at least partially exposed.

Since the second layer 520 including an organic material is directly on the upper surface 460*a* of the first organic layer 460 including an organic material and comes in contact with the inner surface of the first layer 510 including an organic material, the spreadability of the second layer 520 may be improved, and thus the thickness of the second layer 520 may be reduced. In an embodiment, for example, since the second layer 520 including a hydrophilic organic material is directly on the upper surface 460*a* of the first organic layer 460 including a hydrophilic organic material and comes in contact with the inner surface of the first layer 510 including a hydrophilic organic material, the spreadability of the second layer 520 may be improved, and thus the thickness of the second layer 520 may be reduced. Also, in an embodiment, since the second layer 520 including a hydrophobic organic material is directly on the upper surface 460*a* of the first organic layer 460 including a hydrophobic organic material and comes in contact with the inner surface of the first layer 510 including a hydrophobic organic material, the spreadability of the second layer 520 may be improved, and thus the thickness of the second layer 520 may be reduced.

Figure 11:
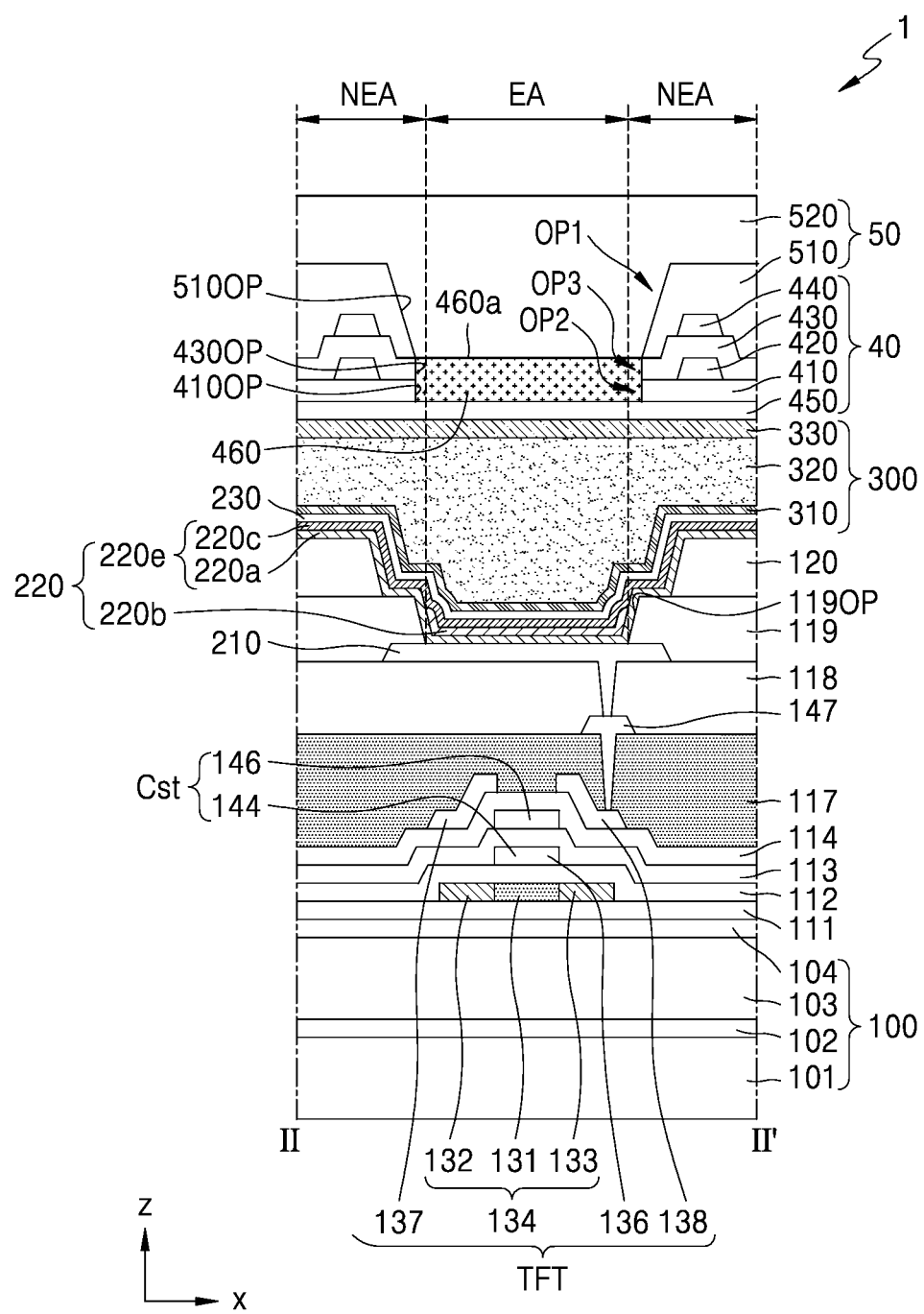
FIG. 11 is a schematic cross-sectional view of an embodiment of a display apparatus.

FIG. 11 is a schematic cross-sectional view of an embodiment of a display apparatus 1. The embodiment of FIG. 11 differs from the embodiment of FIG. 9, in that a first organic layer 460 is arranged in an opening 410OP defined in a first insulating layer 410 and an opening 430OP defined in a second insulating layer 430. In FIG. 11, the same reference numerals as those in FIG. 9 denote the same members, and redundant descriptions thereof will be omitted.

Referring to FIG. 11, an input sensing layer 40 may be on a thin-film encapsulation layer 300. The input sensing layer 40 may include a first insulating layer 410 and a second insulating layer 430. Also, the input sensing layer 40 may include a first conductive layer 420 on the first insulating layer 410, and a second conductive layer 440 between the first insulating layer 410 and the second insulating layer 430.

The input sensing layer 40 may include a third insulating layer 450 below the first insulating layer 410. The third insulating layer 450 may be directly on a second inorganic layer 330 of the thin-film encapsulation layer 300.

The first insulating layer 410 may have an opening 410OP (e.g., a second opening OP2) corresponding to an emission area EA defined by a pixel defining layer 119. The opening 410OP defined in the first insulating layer 410 may at least partially overlap the emission area EA.

The second insulating layer 430 may have an opening 430OP (e.g., a third opening OP3) corresponding to the emission area EA defined by the pixel defining layer 119. The opening 430OP defined in the second insulating layer 430 may at least partially overlap the emission area EA.

According to an embodiment, the opening 410OP defined in the first insulating layer 410 and the opening 430OP defined in the second insulating layer 430 may at least partially overlap each other.

According to an embodiment, a first organic layer 460 may be arranged in the opening 410OP defined in the first insulating layer 410 and the opening 430OP defined in the second insulating layer 430. The first organic layer 460 may at least partially overlap the emission area EA defined by the pixel defining layer 119. Also, at least a portion of the first organic layer 460 may at least partially overlap a non-emission area NEA around the emission area EA. The lower surface of the first organic layer 460 may be coplanar with a lower surface of the first insulating layer 410.

An optical functional layer 50 may be on the input sensing layer 40. The optical functional layer 50 may include a first layer 510 and a second layer 520 on the first layer 510.

According to an embodiment, the first layer 510 may be arranged to cover the second conductive layer 440 of the input sensing layer 40. The first layer 510 may protect the second conductive layer 440 of the input sensing layer 40, or may act as an insulating layer that insulates the second conductive layer 440. According to an embodiment, the first layer 510 may have an opening 510OP (e.g., a first opening OP1) overlapping the opening 119OP defined in the pixel defining layer 119. According to an embodiment, at least a portion of the upper surface 460*a* of the first organic layer 460 may be exposed through the opening 510OP defined in the first layer 510. Edges of the first organic layer 460 may correspond to a sidewall of the first layer 510 which defines the opening 510OP.

At least a portion of the second layer 520 may be arranged in the opening 510OP defined in the first layer 510. That is, at least a portion of the second layer 520 may fill the opening 510OP defined in the first layer 510.

The second layer 520 may be on the first organic layer 460 at least partially exposed through the opening 510OP defined in the first layer 510. In an embodiment, for example, the second layer 520 may be directly on the upper surface 460*a* of the first organic layer 460 at least partially exposed.

Since the second layer 520 including an organic material is directly on the upper surface 460*a* of the first organic layer 460 including an organic material and comes in contact with the inner surface of the first layer 510 including an organic material, the spreadability of the second layer 520 may be improved, and thus the thickness of the second layer 520 may be reduced. Since the second layer 520 including a hydrophilic organic material is directly on the upper surface 460*a* of the first organic layer 460 including a hydrophilic organic material and comes in contact with the inner surface of the first layer 510 including a hydrophilic organic material, the spreadability of the second layer 520 may be improved, and thus the thickness of the second layer 520 may be reduced. Also, since the second layer 520 including a hydrophobic organic material is directly on the upper surface 460a of the first organic layer 460 including a hydrophobic organic material and comes in contact with the inner surface of the first layer 510 including a hydrophobic organic material, the spreadability of the second layer 520 may be improved, and thus the thickness of the second layer 520 may be reduced.

Figure 12:
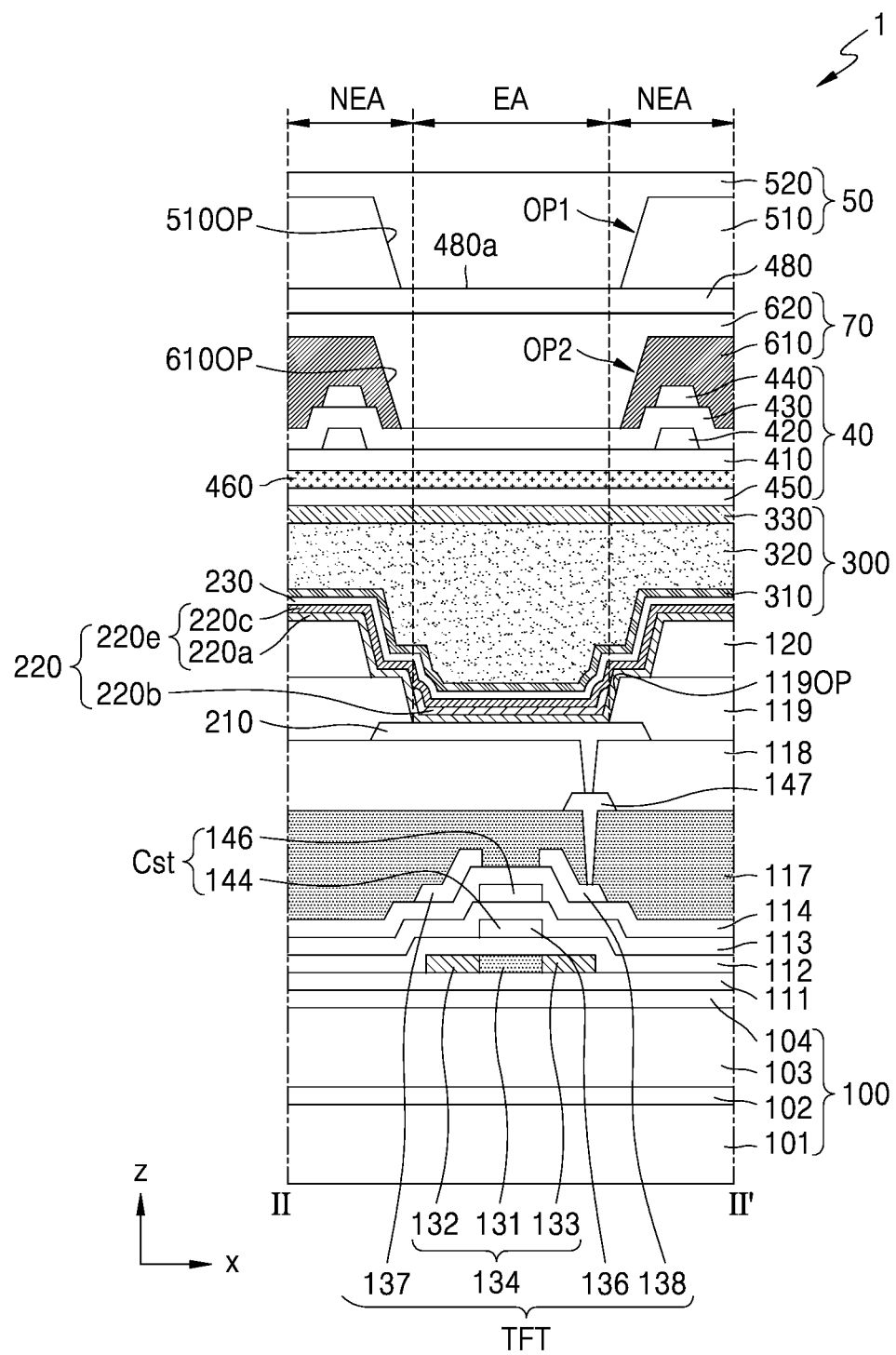
FIGS. 12 and 13 are schematic cross-sectional views of embodiments of a display apparatus.
Figure 13:
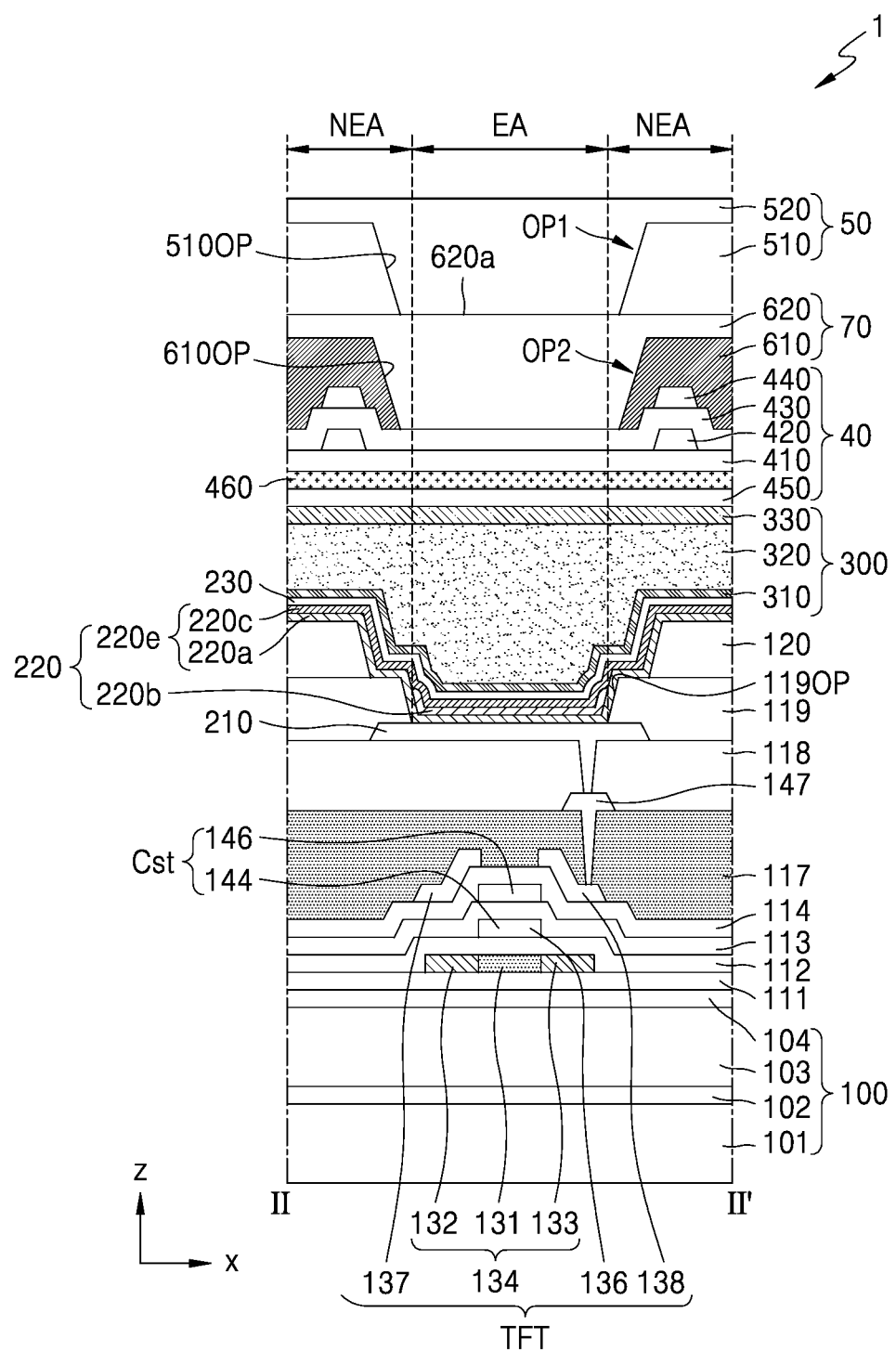

FIGS. 12 and 13 are schematic cross-sectional views of embodiments of a display apparatus 1. The embodiment of FIG. 12 differs from the embodiment of FIG. 11, in that an anti-reflective layer 70 is between an input sensing layer 40 and an optical functional layer 50. In FIG. 12, the same reference numerals as those in FIG. 9 denote the same members, and redundant descriptions thereof will be omitted.

Referring to FIG. 12, the display apparatus 1 may include the input sensing layer 40 and the optical functional layer 50, which are on a thin-film encapsulation layer 300. Also, the display apparatus 1 may further include the anti-reflective layer 70 between the input sensing layer 40 and the optical functional layer 50.

The input sensing layer 40 may include a first insulating layer 410 and a second insulating layer 430. Also, the input sensing layer 40 may include a first conductive layer 420 on the first insulating layer 410, and a second conductive layer 440 between the first insulating layer 410 and the second insulating layer 430. According to an embodiment, the first conductive layer 420 and the second conductive layer 440 may be electrically connected to each other through a contact hole defined in the second insulating layer 430. According to an embodiment, the first conductive layer 420 and the second conductive layer 440 may be the first sensing electrodes or the second sensing electrodes described above with reference to FIG. 8.

The input sensing layer 40 may include a third insulating layer 450 below the first insulating layer 410. The third insulating layer 450 may be directly on a second inorganic layer 330 of the thin-film encapsulation layer 300. According to an embodiment, the third insulating layer 450 may be omitted.

According to an embodiment, a first organic layer 460 may be on the thin-film encapsulation layer 300. The first organic layer 460 may be between the third insulating layer 450 and the first insulating layer 410. According to an embodiment, the first organic layer 460 may be integrally formed so as to correspond to an emission area EA and a non-emission area NEA. According to an embodiment, the first organic layer 460 may include an organic material. According to an embodiment, the first organic layer 460 may include the same material as that of an organic planarization layer 470 (in FIG. 14) to be described later with reference to FIG. 14, and may be formed by the same process. According to an embodiment, the first organic layer 460 may be omitted.

The anti-reflective layer 70 may be on the input sensing layer 40. The anti-reflective layer 70 may include a light shielding layer 610 and a color filter 620. The color filter 620 may be arranged to correspond to (e.g., overlap) the emission area EA defined by the pixel defining layer 119, and the light shielding layer 610 may be arranged to correspond to (e.g., overlap) the non-emission area NEA around the emission area EA. The light shielding layer 610 may not overlap the emission area EA and may be only outside of the emission area EA.

According to an embodiment, the light shielding layer 610 may be arranged to cover the second conductive layer 440 of the input sensing layer 40. The light shielding layer 610 may protect the second conductive layer 440 of the input sensing layer 40, or may act as an insulating layer that insulates the second conductive layer 440.

Instead of arranging a separate insulating layer on the second conductive layer 440 of the input sensing layer 40, the light shielding layer 610 of the anti-reflective layer 70 may be used to protect or insulate the second conductive layer 440. Therefore, the number of insulating layers may be reduced, and the process may be simplified.

According to an embodiment, the light shielding layer 610 may include an opening 610OP (e.g., a second opening OP2) exposing at least a portion of a top surface of the second insulating layer 430 therebelow. The top surface of the second insulating layer 430 may be at least partially exposed through the opening 610OP defined in the light shielding layer 610.

According to an embodiment, the light shielding layer 610 may include a black matrix. The light shielding layer 610 may improve color clarity and contrast. The light shielding layer 610 may include at least one of a black pigment, a black dye or black particles. According to an embodiment, the light shielding layer 610 may include Cr or $CrO_X$, $Cr/CrO_X$, $Cr/CrO_X/CrN_Y$, resin (carbon pigment, red, green, blue ("RGB") mixed pigment), graphite, non-Cr-based materials, and the like. The light shielding layer 610 may prevent or reduce light mixing by absorbing light emitted from the organic light-emitting diode OLED therebelow, or absorbing light reflected from the color filter 620 thereabove.

The color filter 620 may be on the light shielding layer 610. A plurality of color filters 620 may be provided, and each of the color filters 620 may have a red, green, or blue color according to the color of light emitted from the organic light-emitting diode OLED.

An optical functional layer 50 may be on the anti-reflective layer 70. The optical functional layer 50 may include a first layer 510 and a second layer 520 on the first layer 510. The first layer 510 may include an organic material having a first refractive index, and the second layer 520 may include an organic material having a second refractive index. In this case, the second refractive index of the second layer 520 may be greater than the first refractive index of the first layer 510.

A second organic layer 480 may be between the anti-reflective layer 70 and the optical functional layer 50. According to an embodiment, the second organic layer 480 may include an organic material.

According to an embodiment, the first layer 510 may define an opening 510OP (e.g., a first opening OP1) overlapping the opening 119OP defined in the pixel defining layer 119. According to an embodiment, at least a portion of the upper surface 480a of the second organic layer 480 may be exposed to outside the first layer 510 through the opening 510OP defined in the first layer 510.

At least a portion of the second layer 520 may be arranged in the opening 510OP defined in the first layer 510. That is, at least a portion of the second layer 520 may fill the opening 510OP defined in the first layer 510.

The second layer 520 may be on the second organic layer 480 at least partially exposed through the opening 510OP defined in the first layer 510. In an embodiment, for example, the second layer 520 may be directly on the upper surface 480a of the second organic layer 480 at least partially exposed through the opening 510OP defined in the first layer 510.

Since the second layer 520 including an organic material is directly on the upper surface 480a of the second organic layer 480 including an organic material, the spreadability of the second layer 520 may be improved, and thus the thickness of the second layer 520 on the second organic layer 480 may be reduced.

According to an embodiment, as illustrated in FIG. 13, the second organic layer 480 between the anti-reflective layer 70 and the optical functional layer 50 may be omitted. When the second organic layer 480 between the anti-reflective layer 70 and the optical functional layer 50 is omitted, the optical functional layer 50 may be directly on the anti-reflective layer 70. Alternatively, according to an embodiment, an optical clear adhesive or the like may be additionally on the optical functional layer 50 and the anti-reflective layer 70.

When the optical functional layer 50 is directly on the anti-reflective layer 70, the first layer 510 may include the opening 510OP exposing at least a portion of the upper surface 620a of the color filter 620. The second layer 520 may be on the color filter 620 at least partially exposed through the opening 510OP defined in the first layer 510. That is, the second layer 520 may be directly on the upper surface 620a of the color filter 620 at least partially exposed through the opening 510OP defined in the first layer 510.

Since the second layer 520 including an organic material is directly on the upper surface 620a of the color filter 620 including an organic material, the spreadability of the second layer 520 may be improved, and thus the thickness of the second layer 520 on the color filter 620 may be reduced.

Figure 14:
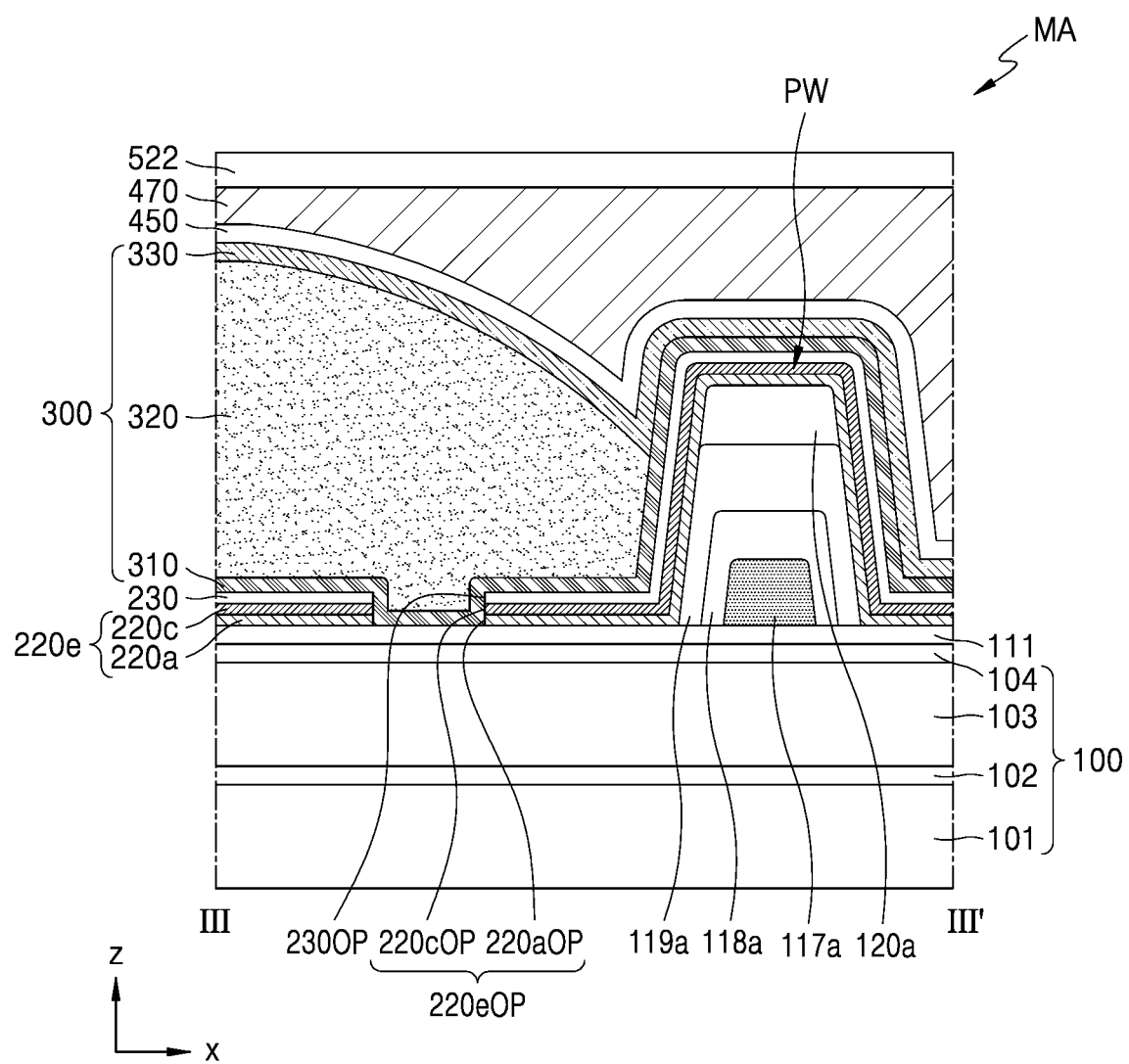
FIGS. 14 and 15 are schematic cross-sectional views of embodiments of a display apparatus.
Figure 15:
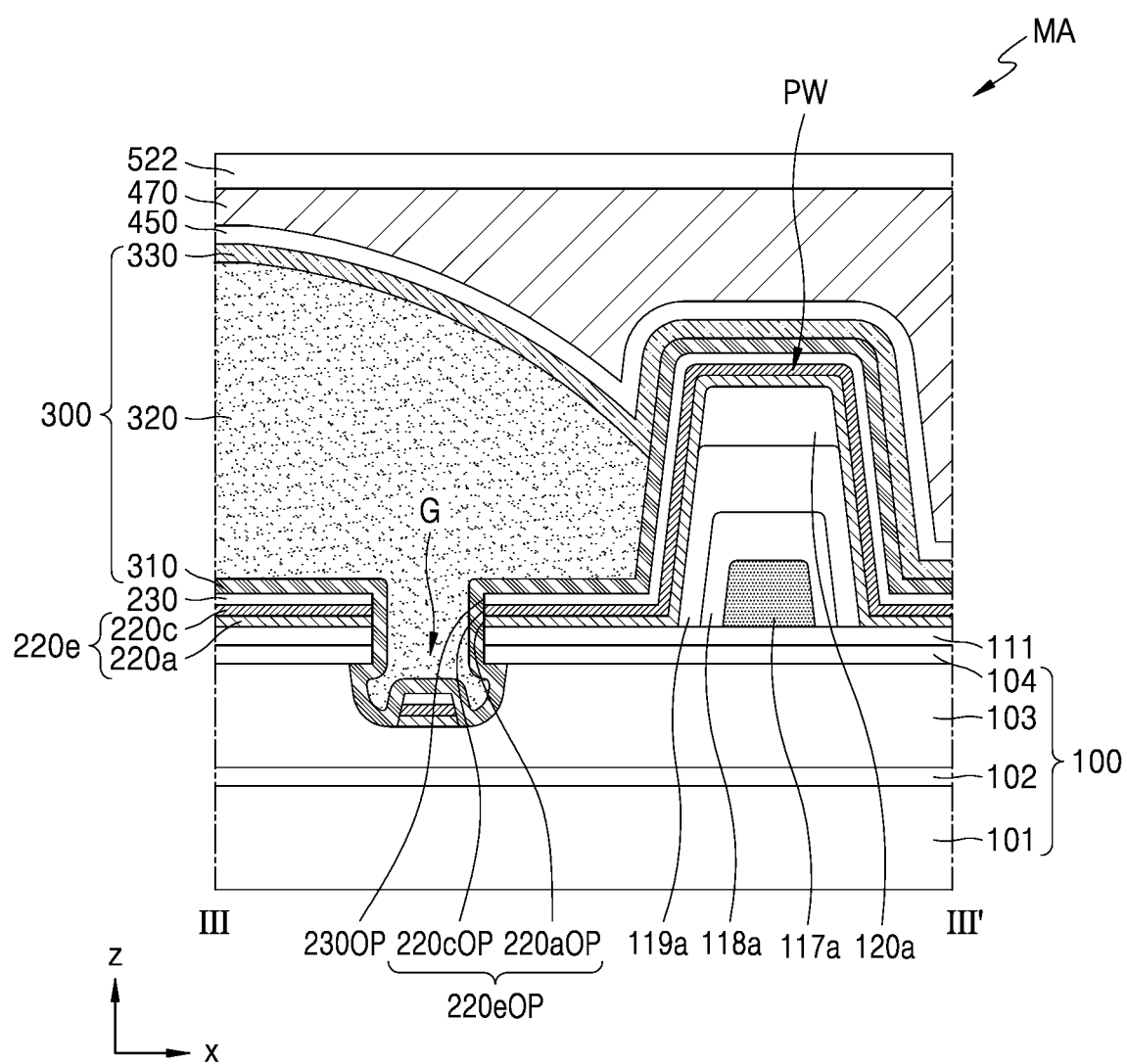

FIGS. 14 and 15 are schematic cross-sectional views of embodiments of a display apparatus 1. FIGS. 14 and 15 are cross-sectional views of the display apparatus 1 taken along line III-III' of FIG. 7.

Referring to FIGS. 7 and 14, a dam PW may be arranged in the third area MA between the first area DA and the second area OA. Although FIG. 14 illustrates that one of the dam PW is arranged in the third area MA, the disclosure is not limited thereto. Various modifications may be made thereto. In an embodiment, for example, in the third area MA, two or more dams PW may be arranged or three or more dams PW may be arranged.

The dam PW may be on the substrate 100 and may protrude from the substrate 100. The dam PW may include a plurality of organic insulating layers sequentially stacked. The dam PW may have a structure in which a first organic insulating layer 117a, a second organic insulating layer 118a, a third organic insulating layer 119a, and a fourth organic insulating layer 120a are stacked.

According to an embodiment, the first organic insulating layer 117a may include the same material as that of the first planarization layer 117 of FIG. 9, the second organic insulating layer 118a may include the same material as that of the second planarization layer 118 of FIG. 9, the third organic insulating layer 119a may include the same material as that of the pixel defining layer 119 of FIG. 9, and the fourth organic insulating layer 120a may include the same material as that of the spacer 120 of FIG. 9. The first organic insulating layer 117a may be in a same layer as the first planarization layer 117 of FIG. 9, the second organic insulating layer 118a may be in a same layer as the second planarization layer 118 of FIG. 9, the third organic insulating layer 119a may be in a same layer as the pixel defining layer 119 of FIG. 9, and the fourth organic insulating layer 120a may be in a same layer as the spacer 120 of FIG. 9. As being in a same layer, elements may be respective portions or patterns of a same material layer on the substrate 100.

An organic functional layer 220e completely covering the first area DA may extend to the third area MA. The organic functional layer 220e may include a first functional layer 220a and a second functional layer 220c.

According to an embodiment, at least a portion of the organic functional layer 220e included in the intermediate layer 220 in the third area MA, for example, the first functional layer 220a and/or the second functional layer 220c may be removed and omitted from the third area MA. In other words, at least a portion of the organic functional layer 220e may be disconnected in the third area MA. Therefore, the organic functional layer 220e may define an opening 220eOP in the third area MA. In this regard, although FIG. 14 illustrates that one of the opening 220eOP is arranged in the third area MA, the disclosure is not limited thereto. A plurality of openings 220eOP may be provided in the third area MA. That is, a plurality of disconnected portions of the organic functional layer 220e in the third area MA may be provided.

The organic functional layer 220e may include a first functional layer 220a and a second functional layer 220c. An opening 220aOP in the first functional layer 220a and an opening 220cOP in the second functional layer 220c may be aligned with each other to form the above-described opening 220eOP. The opening 220aOP of the first functional layer 220a and the opening 220cOP of the second functional layer 220c may be defined by removing a portion of the first functional layer 220a and a portion of the second functional layer 220c. Due to the openings 220aOP and 220cOP, the first functional layer 220a and the second functional layer 220c may be discontinuous in the third area MA.

An insulating layer (e.g., a buffer layer 111) below the organic functional layer 220e may be exposed to outside the organic functional layer 220e through the opening 220eOP defined in the organic functional layer 220e, and the first inorganic layer 310 may be in direct contact with the buffer layer 111 at the opening 220eOP. The buffer layer 111 may include an inorganic insulating material, and the contact between the first inorganic layer 310 and the buffer layer 111 may locally block the progress of moisture.

Since the organic functional layer 220e included in the intermediate layer 220 completely covers the first area DA, a passage of moisture flowing through the through hole or opening 10H in FIG. 2A) of the display panel 10 (in FIG. 2A) may be provided. However, according to an embodiment, since the organic functional layer 220e includes the opening 220eOP in the third area MA, the progress of moisture through the organic functional layer 220e may be effectively prevented or reduced.

An opposite electrode 230 completely covering the first area DA may extend to the third area MA. According to an embodiment, at least a portion of the opposite electrode 230 may be removed in the third area MA. In other words, the opposite electrode 230 may be disconnected in the third area MA. In an embodiment, each of the organic functional layer 220e and the opposite electrode 230 is disconnected at a position between the first area DA and the dam PW. Therefore, the opposite electrode 230 may include an opening 230OP in the third area MA. In this regard, although FIG. 14 illustrates that one of the opening 230OP is arranged in the third area MA, the disclosure is not limited thereto. A plurality of disconnected portions of the opposite electrode 230 in the third area MA may be provided.

According to an embodiment, the opposite electrode 230 provided or formed to completely cover the first area DA extends to the third area MA, an edge or side surface of the opposite electrode 230 may be between the first area DA and the dam PW. The edge of the opposite electrode 230 is a portion of the opposite electrode 230 closest to the through hole (or opening 10H in FIG. 2A), and a layer corresponding to the opposite electrode 230 may not be present in an area from the edge of the opposite electrode 230 to the through hole (or opening 10H. That is, a layer having the same material and structure as those of the opposite electrode 230 may not be present in the area from the edge of the opposite electrode 230 to the through hole or opening 10H.

The opening 230OP defined in the opposite electrode 230 may overlap the opening 220eOP defined in the organic functional layer 220e. In an embodiment, at least a portion of the opposite electrode 230 and the organic functional layer 220e on the third area MA may be removed through a laser lift-off process or the like. The opening 230OP provided or formed at the portion from which at least a portion of the opposite electrode 230 is removed and the opening 220eOP provided or formed at the portion from which at least a portion of the organic functional layer 220e is removed may overlap each other.

An insulating layer (e.g., a buffer layer 111) below the opening 230OP defined in the opposite electrode 230 and the opening 220eOP defined in the organic functional layer 220e may be exposed to outside the opposite electrode 230, and the first inorganic layer 310 may be in direct contact with the buffer layer 111 at the openings 220eOP and 230OP. The buffer layer 111 may include an inorganic insulating material, and the contact between the first inorganic layer 310 and the buffer layer 111 may locally block the progress of moisture.

According to an embodiment, the opposite electrode 230 and the organic functional layer 220e including a first functional layer 220a and a second functional layer 220c may be on the dam PW. The opposite electrode 230 and the organic functional layer 220e including a first functional layer 220a and a second functional layer 220c may extend along outer side surfaces and a top surface of the dam PW. Alternatively, according to an embodiment, the organic functional layer 220e including the first functional layer 220a and the second functional layer 220c may be on the dam PW, while the opposite electrode 230 is not on the dam PW.

A thin-film encapsulation layer 300 may be on the dam PW. The thin-film encapsulation layer 300 may include a first inorganic layer 310, an organic layer 320 and a second inorganic layer 330, which are sequentially stacked. According to an embodiment, the first inorganic layer 310 and the second inorganic layer 330 of the thin-film encapsulation layer 300 may be directly on the dam PW.

According to an embodiment, since the dam PW is provided in the third area MA, a monomer included in or forming the organic layer 320 may be prevented or reduced from being lost to a cutting line.

According to an embodiment, an organic planarization layer 470 may be on the thin-film encapsulation layer 300. The organic planarization layer 470 may include an organic material. The organic planarization layer 470 may include the same material as that of the first organic layer 460 (in FIG. 9) and may be provided or formed by the same process. In an embodiment, for example, in the first organic layer 460 (in FIG. 9) may be a portion in which at least a portion of the organic planarization layer 470 on the third area MA extends to the first area DA.

Since the organic planarization layer 470 is arranged in the third area MA, it is possible to increase the flatness of the third area MA and to prevent or reduce the separation of the input sensing layer 40 (in FIG. 9).

A third insulating layer 450 of the input sensing layer 40 (in FIG. 9) may be below the organic planarization layer 470.

According to an embodiment, an upper layer 522 may be on the organic planarization layer 470. The upper layer 522 may include an organic material. The upper layer 522 may include the same material as that of the second layer 520 of the optical functional layer 50 (in FIG. 9) and may be provided or formed by the same process. In an embodiment, for example, the upper layer 522 may be an extended portion of the second layer 520 which extends from the first area DA to the third area MA to define the extended portion. That is, the upper layer 522 and the second layer 520 may be in a same layer as each other.

According to an embodiment, a refractive index of the upper layer 522 may be greater than a refractive index of the organic planarization layer 470. The upper layer 522 has a refractive index of about 1.65 to about 1.85, and the organic planarization layer 470 may have a refractive index of about 1.3 to about 1.6, which is less than that of the upper layer 522.

Referring to FIG. 15, a groove G may be arranged in the third area MA between the first area DA and the second area OA. Although FIG. 15 illustrates that one of the groove G is arranged in the third area MA, the disclosure is not limited thereto. Various modifications may be made thereto. In an embodiment, for example, in the third area MA, two or more grooves G may be arranged or three or more grooves G may be arranged.

The groove G may be provided or formed by portions of the substrate 100 and the buffer layer 111. The groove G may be provided or formed in a portion from which at least a portion of the second base layer 103, the second barrier layer 104 and the buffer layer 111 are removed. In an embodiment, for example, the groove G may include a recess or hole extended into the second base layer 103, a hole extended through the second barrier layer 104 and a hole extended through the buffer layer 111.

According to an embodiment, the groove G may be provided or formed in a portion from which at least a portion of the opposite electrode 230 and the organic functional layer 220e including the first functional layer 220a and the second functional layer 220c are removed. Therefore, portions of the organic functional layer 220e and the opposite electrode 230 may be disconnected (or separated) from each other at the groove G. Since the organic functional layer 220e and the opposite electrode 230 are disconnected (or separated) from each other at the groove G, it is possible to effectively prevent or reduce moisture or cracks from propagating to the organic light-emitting diode OLED in the first area DA.

According to an embodiment, since the organic functional layer 220e is disconnected (or separated) at the groove G, the organic functional layer 220e may include an opening 220eOP that at least partially overlaps the groove G. That is, the organic functional layer 220e may include the opening 220eOP in the third area MA, and the opening 220eOP may at least partially overlap the groove G. The organic functional layer 220e may include a first functional layer 220a and a second functional layer 220c. An opening 220aOP of the first functional layer 220a and an opening 220cOP of the second functional layer 220c may overlap each other to form the above-described opening 220eOP. Therefore, the opening 220aOP of the first functional layer 220a and the opening 220cOP of the second functional layer 220c may at least partially overlap the groove G.

According to an embodiment, since the opposite electrode 230 is disconnected (or separated) at the groove G, the opposite electrode 230 may include an opening 230OP that at least partially overlaps the groove G. That is, the opposite electrode 230 may include the opening 230OP in the third area MA, and the opening 230OP may at least partially overlap the groove G.

According to an embodiment, a thin-film encapsulation layer 300 may be in the groove G. In an embodiment, for example, a first inorganic layer 310 of the thin-film encapsulation layer 300 may extend into and along inner sidewalls of layers which form the groove G. Also, an organic layer 320 of the thin-film encapsulation layer 300 may be arranged to cover the groove G.

According to one or more embodiments, the display apparatus 1 in which transmittance is improved may be implemented by improving the spreadability of the optical functional layer 50 on the input sensing layer 40 by using the spreading characteristics of the hydrophilic material and the hydrophobic material. The scope of the disclosure is not limited by such an effect.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
in order from the substrate:
a light-emitting element comprising a light-emitting layer, a light emission area and a non-emission area which is adjacent to the light emission area;
an input sensing layer comprising a first insulating layer corresponding to the non-emission area and defining a first opening corresponding to the light emission area; and
an optical functional layer comprising in order from the substrate:
a first layer having a refractive index, corresponding to the non-emission area and defining a second opening corresponding to the light emission area, and
a second layer facing the first layer, having a refractive index greater than the refractive index of the first layer and extending to the light emission area; and
an organic layer corresponding to the light emission area,
wherein at the light emission area, the second layer of the optical functional layer is directly on an upper surface of the organic layer which is closest to the optical functional layer.

2. The display apparatus of claim 1, wherein
the input sensing layer further comprises a second insulating layer which faces the first insulating layer, extends to the light emission area and is closer to the light-emitting element than the first insulating layer, and the organic layer is between the first insulating layer and the second insulating layer within the input sensing layer.

3. The display apparatus of claim 1, wherein
the second layer of the optical functional layer has a thickness from the upper surface of the organic layer, and
the thickness of the second layer is 15 micrometers to 20 micrometers.

4. The display apparatus of claim 1, wherein within the optical functional layer the refractive index of the second layer is greater than or equal to 1.6.

5. The display apparatus of claim 1, wherein the second layer of the optical functional layer extends into the second opening to be directly on the upper surface of the organic layer.

6. The display apparatus of claim 1, wherein
the first insulating layer of the input sensing layer comprises side surfaces which define the first opening corresponding to the light emission area, and
the first layer of the optical functional layer covers the side surfaces of the first insulating layer.

7. The display apparatus of claim 1, wherein
the input sensing layer further comprises in order from the substrate:
the first insulating layer, and
a first conductive layer facing the first insulating layer, and
the first layer of the optical functional layer covers the first conductive layer.

8. The display apparatus of claim 2, further comprising:
an electronic functional element which using light or sound to provide a function to the display apparatus; and
in a direction along the substrate:
a first area corresponding to the light-emitting element, the light emission area and the non-emission area,
a second area corresponding to the electronic functional element, and
a third area between the first area and the second area.

9. The display apparatus of claim 8, wherein the second insulating layer of the input sensing layer extends from the light emission area in the first area and to the third area which is between the first area and the second area.

10. The display apparatus of claim 9, further comprising an organic planarization layer in the third area,
wherein
the second layer of the optical functional layer extends from the light emission area in the first area and to the third area, and
in the third area, the second layer is directly on the organic planarization layer.

11. The display apparatus of claim 10, wherein the organic layer and the organic planarization layer include a same material.

12. The display apparatus of claim 8, wherein the light-emitting element which corresponds to the first area includes a first electrode, an organic functional layer of the light-emitting layer and, a second electrode in order from the substrate,
further comprising:
the organic functional layer extending from the first area to the third area; and
in the third area:
an opening in the organic functional layer; and
a dam between the second area and the opening in the organic functional layer.

13. The display apparatus of claim 1, wherein the organic layer extends from the light emission area and into the non-emission area.

14. The display apparatus of claim 13, wherein the organic layer extends into the first opening of the input sensing layer.

15. A display apparatus comprising:
a substrate; and
in order from the substrate:
  a light-emitting element comprising a light emission area and a non-emission area which is adjacent to the light emission area;
  an input sensing layer;
  an anti-reflective layer; and
  an optical functional layer comprising:
    a first layer having a refractive index, corresponding to the non-emission area and defining a first opening corresponding to the light emission area, and
    a second layer facing the first layer and having a refractive index greater than the refractive index of the first layer and extending to the light emission area.

16. The display apparatus of claim 15, wherein the input sensing layer comprises in order from the substrate:
a first insulating layer; and
a first conductive layer facing the first insulating layer.

17. The display apparatus of claim 16, wherein
the anti-reflective layer comprises:
  a light shielding layer corresponding to the non-emission area and defining a second opening corresponding to the light emission area; and
  a color filter facing the light shielding layer,
wherein
the light shielding layer of the anti-reflective layer covers the first conductive layer of the input sensing layer, and
at the light emission area, the second layer of the optical functional layer is directly on an upper surface of the color filter which is closest to the optical functional layer.

18. The display apparatus of claim 17, wherein the first layer of the optical functional layer faces the light shielding layer of the anti-reflective layer with the color filter therebetween.

19. The display apparatus of claim 16, wherein the input sensing layer further comprises a second insulating layer which faces the first insulating layer, extends to the light emission area and is closer to the light-emitting element than the first insulating layer,
further comprising a first organic layer between the first insulating layer and the second insulating layer within the input sensing layer.

20. The display apparatus of claim 19, further comprising a second organic layer between the anti-reflective layer and the optical functional layer,
wherein at the light emission area, the second layer of the optical functional layer is directly on an upper surface of the second organic layer which is closest to the optical functional layer.

21. A display apparatus comprising:
an electronic functional element which uses light or sound to provide a function to the display apparatus;
a light-emitting element comprising an intermediate layer including an organic functional layer, and an opposite electrode which faces the intermediate layer;
a substrate comprising:
  a first area corresponding to the light-emitting element,
  a second area corresponding to the electronic functional element, and
  a third area between the first area and the second area;
an organic layer on the substrate in the first area thereof; and
in the third area:
  a dam on the substrate;
  an organic planarization layer on the substrate, having a refractive index and including a same material as the organic layer in the first area; and
  an upper layer on the organic planarization layer and having a refractive index greater than the refractive index of the organic planarization layer,
wherein
each of the organic functional layer of the intermediate layer and the opposite electrode extend from the first area to the third area, and
within the third area, each of the organic functional layer and the opposite electrode is disconnected at a position between the first area and the dam.

22. The display apparatus of claim 21, further comprising in order from the substrate within the first area of the substrate:
the light-emitting element further comprising a light emission area and a non-emission area which is adjacent to the light emission area;
an input sensing layer; and
an optical functional layer comprising:
  a first layer having a refractive index, corresponding to the non-emission area and defining a first opening corresponding to the light emission area, and
  a second layer facing the first layer, having a refractive index greater than the refractive index of the first layer and extending to the light emission area.

23. The display apparatus of claim 22, wherein
the input sensing layer comprises a first insulating layer corresponding to the non-emission area and defining a second opening corresponding to the light emission area, and
at the light emission area, the second layer of the optical functional layer is directly on an upper surface of the organic layer which is closest to the optical functional layer.

24. The display apparatus of claim 23, wherein the second layer of the optical functional layer includes a same material as the upper layer.

25. The display apparatus of claim 23, wherein
the second layer of the optical functional layer has a thickness from the upper surface of the organic layer, and
the thickness of the second layer is 15 micrometers to 20 micrometers.

26. The display apparatus of claim 23, wherein the second layer of the optical functional layer extends into the second opening of the input sensing layer to be directly on the upper surface of the organic layer.

27. The display apparatus of claim 22, further comprising an anti-reflective layer between the input sensing layer and the optical functional layer,
wherein
the anti-reflective layer comprises:
  a light shielding layer corresponding to the non-emission area and defining a third opening corresponding to the light emission area, and
  an organic layer including a color filter facing the light shielding layer, and at the light emission area, the second layer of the optical functional layer is directly on an upper surface of the organic layer including the color filter, the upper surface being closest to the optical functional layer.

28. The display apparatus of claim 27, wherein the first layer of the optical functional layer faces the light shielding layer of the anti-reflective layer with the color filter therebetween.

29. The display apparatus of claim 21, further comprising in the third area a groove in the substrate at the position between the first area and the dam.

30. The display apparatus of claim 29, wherein the organic functional layer and the opposite electrode are disconnected in the third area by the groove.

* * * * *